US012564070B2

(12) United States Patent
Takaishi

(10) Patent No.: US 12,564,070 B2
(45) Date of Patent: Feb. 24, 2026

(54) METHOD OF MANUFACTURING SEMICONDUCTOR DEVICE

(71) Applicant: RENESAS ELECTRONICS CORPORATION, Tokyo (JP)

(72) Inventor: Ryusei Takaishi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 381 days.

(21) Appl. No.: 18/452,829

(22) Filed: Aug. 21, 2023

(65) Prior Publication Data

US 2024/0136302 A1    Apr. 25, 2024
US 2024/0234331 A9    Jul. 11, 2024

(30) Foreign Application Priority Data

Oct. 25, 2022    (JP) ................................. 2022-170856

(51) Int. Cl.
| | |
|---|---|
| *H01L 23/544* | (2006.01) |
| *H01L 23/00* | (2006.01) |
| *H01L 23/31* | (2006.01) |
| *H01L 23/495* | (2006.01) |
| *H01L 25/065* | (2023.01) |
| *H01L 25/16* | (2023.01) |

(52) U.S. Cl.
CPC ........ *H01L 23/544* (2013.01); *H01L 23/3157* (2013.01); *H01L 23/49541* (2013.01); *H01L 23/49575* (2013.01); *H01L 23/49586* (2013.01); *H01L 24/05* (2013.01); *H01L 24/48* (2013.01); *H01L 24/78* (2013.01); *H01L 24/85* (2013.01); *H01L 25/0657* (2013.01); *H01L 25/16* (2013.01); *H01L 2223/54426* (2013.01); *H01L 2224/05013* (2013.01); *H01L 2224/48145* (2013.01); *H01L 2224/48175* (2013.01); *H01L 2224/78* (2013.01); *H01L 2224/85125* (2013.01); *H01L 2924/1305* (2013.01); *H01L 2924/13091* (2013.01)

(58) Field of Classification Search
None
See application file for complete search history.

(56) References Cited

U.S. PATENT DOCUMENTS

| | | | | |
|---|---|---|---|---|
| 2005/0167471 | A1* | 8/2005 | Enokido | ............... B23K 20/004 228/103 |
| 2012/0024089 | A1* | 2/2012 | Couey | ..................... H01L 24/85 228/102 |
| 2019/0196179 | A1* | 6/2019 | Sarkar | ................. G02B 27/1086 |
| 2021/0296268 | A1* | 9/2021 | Braganca, Jr. | .......... H01L 24/81 |

FOREIGN PATENT DOCUMENTS

| | | |
|---|---|---|
| JP | 02-090634 A | 3/1990 |
| JP | 2000-012603 A | 1/2000 |

\* cited by examiner

*Primary Examiner* — Mark W Tornow
(74) *Attorney, Agent, or Firm* — Rimon P.C.

(57) ABSTRACT

A bonding region is specified by having a horizontal line partially constituting crosshairs displayed on a monitor of a wire bonding apparatus superimposed on a first line segment of a first marker, and having a vertical line partially constituting the crosshairs superimposed on a first line segment of a second marker.

9 Claims, 20 Drawing Sheets

START

PREPARING LEAD FRAME — S101

PREPARING SEMICONDUCTOR CHIP CHP1 AND SEMICONDUCTOR CHIP CHP2 — S102

MOUNTING SEMICONDUCTOR CHIP CHP1 — S103

MOUNTING SEMICONDUCTOR CHIP CHP2 — S104

WIRE BONDING — S105

RESIN SEALING — S106

END

START

RECOGNIZING SEMICONDUCTOR CHIP — S201

SPECIFYING POSITION OF PAD — S202

SPECIFYING BONDING REGION (TEACHING) — S203

MOUNTING BONDING WIRE — S204

END

FIG. 7
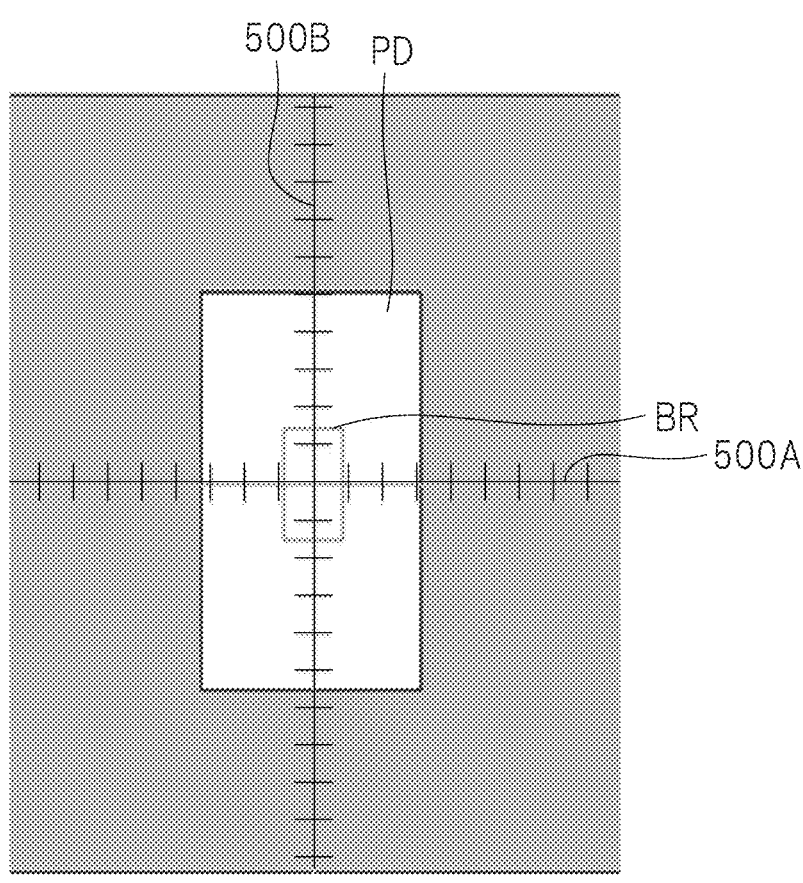
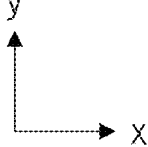

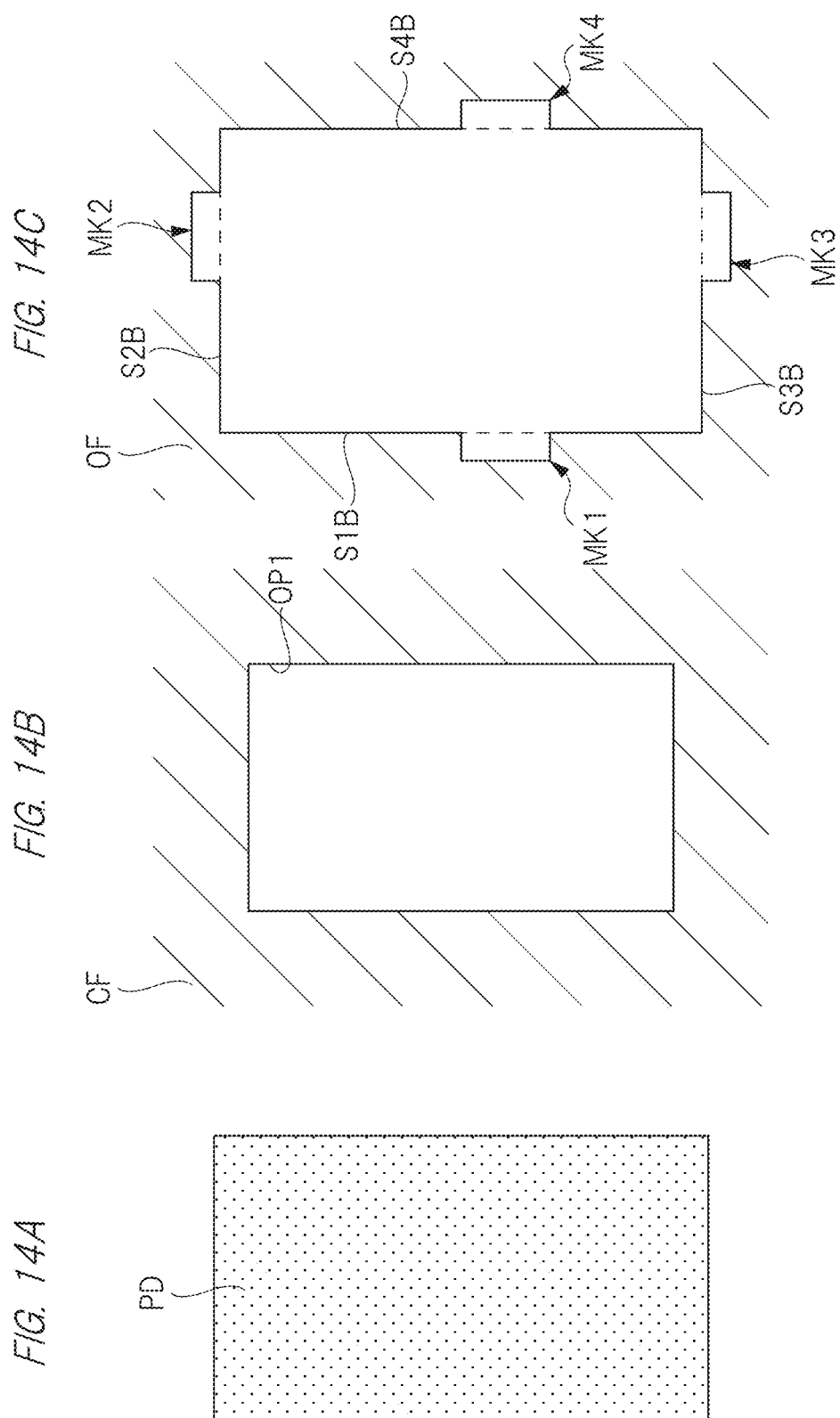

START

TRANSPORTING ONTO STAGE — S301

TAKING IMAGE WITH CAMERA — S302

RECOGNIZING SEMICONDUCTOR CHIP — S303

SPECIFYING POSITION OF PAD — S304

RECOGNIZING MARKER — S305

SUPERIMPOSING CROSSHAIRS — S306

SPECIFYING BONDING REGION — S307

CONNECTING BONDING WIRE — S308

END

METHOD OF MANUFACTURING SEMICONDUCTOR DEVICE

CROSS-REFERENCE TO RELATED APPLICATIONS

The disclosure of Japanese Patent Application No. 2022-170856 filed on Oct. 25, 2022 including the specification, drawings and abstract is incorporated herein by reference in its entirety.

BACKGROUND

The present invention relates to a method of manufacturing a semiconductor device, and for example, relates to a technique effective for application to a method of manufacturing a semiconductor device having a bonding wire.

There are disclosed techniques listed below.

[Patent Document 1] Japanese Unexamined Patent Application Publication No. H2-90634

[Patent Document 2] Japanese Unexamined Patent Application Publication No. 2000-12603

Patent Document 1 discloses a technique relating to a semiconductor device provided with a bonding pad having an alignment mark made of a slit or a protrusion and corresponding to a positioning cross-mark of a wire bonder.

Patent Document 2 discloses a technique in which a bonding pad is provided with a shape allowing a center of the bonding pad to be visually recognized.

SUMMARY

There is, for example, a semiconductor device having a configuration in which a bonding wire is connected to a pad formed on a front surface of a semiconductor chip. In such a semiconductor device, in order to suppress characteristic fluctuations of the semiconductor device caused by misalignment of a bonding position to which the bonding wire is connected, it is required to accurately specify a bonding region of the pad to which the bonding wire is connected. That is, in the semiconductor device having the bonding wire, it is desired to provide a configuration in which the bonding region of the pad to which the bonding wire is connected can be accurately specified.

According to an embodiment of the present invention, a method of manufacturing a semiconductor device includes steps of: (a) preparing a semiconductor chip having a main surface, a pad formed on the main surface, and an insulating film formed on the main surface; (b) after the step of (a), specifying a bonding region in a portion of the pad exposed in an opening portion formed in the insulating film; and (c) after the step of (b), connecting a bonding wire to the bonding region of the pad.

Here, a planar shape of the pad has a quadrangular shape including a first side and a second side intersecting the first side, and a planar shape of the opening portion has a quadrangular shape including a first side and a second side intersecting the first side. The first side of the pad or the first side of the opening portion is further provided with a first marker, and the second side of the pad or the second side of the opening portion is further provided with a second marker. At this time, the first marker has a first line segment orthogonal to the first side at a first position of the first side, and the second marker has a first line segment orthogonal to the second side at a first position of the second side.

Further, in the step of (b), the bonding region is specified by having a horizontal line partially constituting crosshairs displayed on a monitor of a wire bonding apparatus superimposed on the first line segment of the first marker, and having a vertical line partially constituting the crosshairs superimposed on the first line segment of the second marker.

According to the embodiment, misalignment of the bonding position to which the bonding wire is connected can be suppressed, whereby characteristic fluctuations of the semiconductor device caused by misalignment can be suppressed.

BRIEF DESCRIPTION OF THE DRAWINGS

FIG. 7 is a diagram describing "teaching" in a related art.

FIG. 11A is a diagram showing a planar shape of a pad, FIG. 11B is a diagram showing a planar shape of a first opening portion formed in a cover film, and FIG. 11C is a diagram showing a planar shape of a second opening portion formed in an organic insulating film.

FIG. 13A is a diagram showing a planar shape of a pad, FIG. 13B is a diagram showing a planar shape of a first opening portion formed in a cover film, and FIG. 13C is a diagram showing a planar shape of a second opening portion formed in an organic insulating film.

FIGS. 14A to 14C are diagrams each showing a pad structure in a third modified example, where FIG. 14A is a diagram showing a planar shape of a pad, FIG. 14B is a diagram showing a planar shape of a first opening portion formed in a cover film, and FIG. 14C is a diagram showing a planar shape of a second opening portion formed in an organic insulating film.

FIG. 15A is a diagram showing a planar shape of a pad, FIG. 15B is a diagram showing a planar shape of a first opening portion formed in a cover film, and FIG. 15C is a diagram showing a planar shape of a second opening portion formed in an organic insulating film.

DETAILED DESCRIPTION

Figure 1:
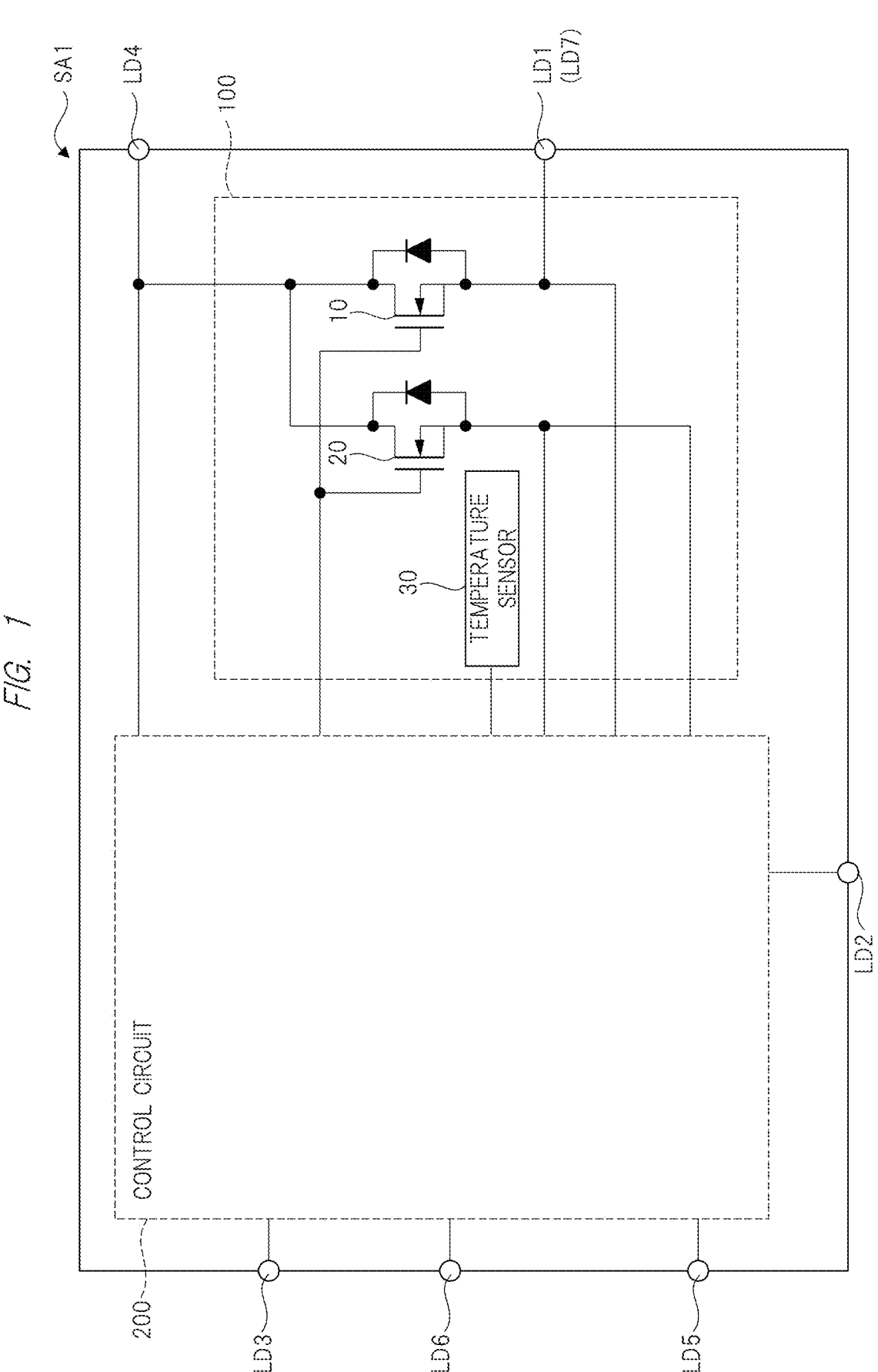
FIG. 1 is a diagram showing a circuit configuration of a semiconductor device including a power transistor and a control circuit configured to control the power transistor.

In all of the drawings used to describe the embodiments, identical members are denoted by identical reference signs, and redundant descriptions thereof are omitted in principle.

Note that, in the accompanying drawings, hatched lines are occasionally provided even if the drawing is a plan view in order to clarify the drawings.

<Configurations of Power Transistor and Control Circuit>

FIG. 1 is a diagram showing a circuit configuration of a semiconductor device SA1 including a power transistor and a control circuit configured to control the power transistor. Here, the power transistor is, for example, a power metal oxide semiconductor field effect transistor (power-MOS-FET).

In FIG. 1, the semiconductor device SA1 has a switching circuit 100 and a control circuit 200, and the switching circuit 100 has a main transistor 10 composing the power transistor, a sense transistor 20, and a temperature sensor 30.

In the switching circuit 100 thus configured, the main transistor 10 is provided between a lead LD4 serving as a power supply terminal that supplies a power supply potential and a lead LD1 (lead LD7) serving as an output terminal. The main transistor 10 functions as a switching element for turning on/off a current that flows between the power supply terminal and the output terminal. Further, the sense transistor 20 has a function to detect a current value of a current that flows through the main transistor 10, and the temperature sensor 30 has a function to detect a temperature of the switching circuit 100.

The control circuit 200 has a function to control the switching circuit 100, and includes, for example, a predriver that applies a gate voltage to a gate electrode of the main transistor 10 and a gate electrode of the sense transistor 20. As shown in FIG. 1, the control circuit 200 is electrically connected to leads LD3 and LD6 serving as input terminals of the semiconductor device SA1, a lead LD2 serving as a ground terminal, and a lead LD5 serving as an output terminal for outputting an output from the control circuit 200 to a device outside of the semiconductor device SA1.

The control circuit 200 is configured to control on/off of the main transistor 10 of the switching circuit 100 based on a control signal input from the lead LD3. That is, the control circuit 200 is configured to switch the gate voltage applied to the gate electrode of the main transistor 10 to control on/off of the main transistor 10.

In this manner, the on/off control of the main transistor 10 makes it possible to control the current supplied from the lead LD1 (serving as the output terminal electrically connected to a source of the main transistor 10) to a load connected to a device outside of the semiconductor device SA1.

Thus, the circuit of the semiconductor device SA1 is configured as described above.

<Configuration of Semiconductor Device>

Next, an example of an implementation configuration of the semiconductor device SA1 will be described.

Figure 2:
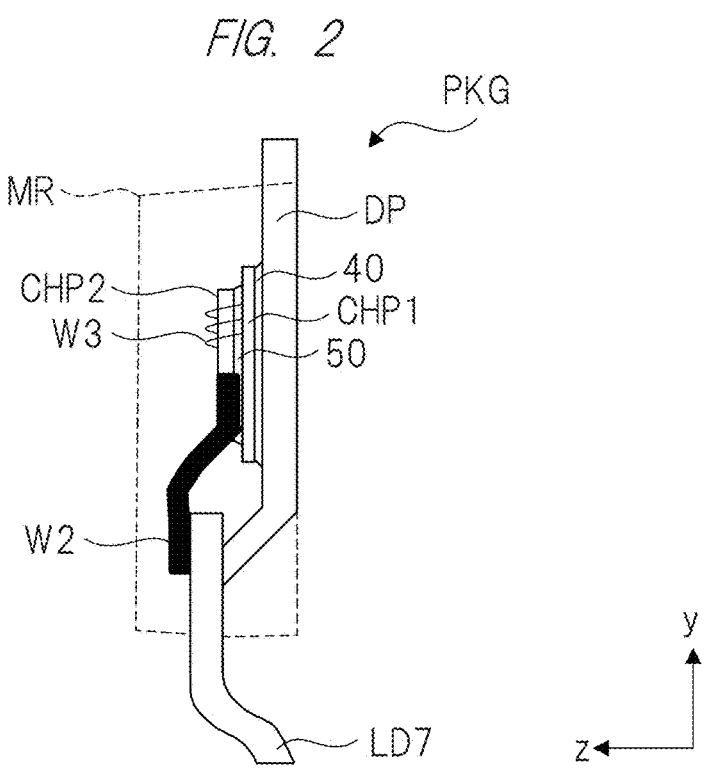
FIG. 2 is a side view of a package structure seen through a sealing body.

FIG. 2 is a side view of a package structure PKG seen through a sealing body MR.

As shown in FIG. 2, the package structure PKG has a die pad DP serving as a chip mounting portion, and a semiconductor chip CHP1 is mounted on the die pad DP with a conductive adhesive material 40 made of solder or silver paste interposed therebetween. A power transistor is formed on the semiconductor chip CHP1. A semiconductor chip CHP2 is mounted on the semiconductor chip CHP1 with an insulating adhesive material 50 interposed therebetween. A control circuit configured to control the power transistor is formed on the semiconductor chip CHP2. Moreover, a source pad (not shown) formed on a front surface of the semiconductor chip CHP1 and the lead LD7 are connected to each other by a bonding wire W2. A sealing body MR covers at least the semiconductor chip CHP1 mounted on the die pad DP, and the semiconductor chip CHP2 and the bonding wire W2 mounted on the semiconductor chip CHP1.

Figure 3:
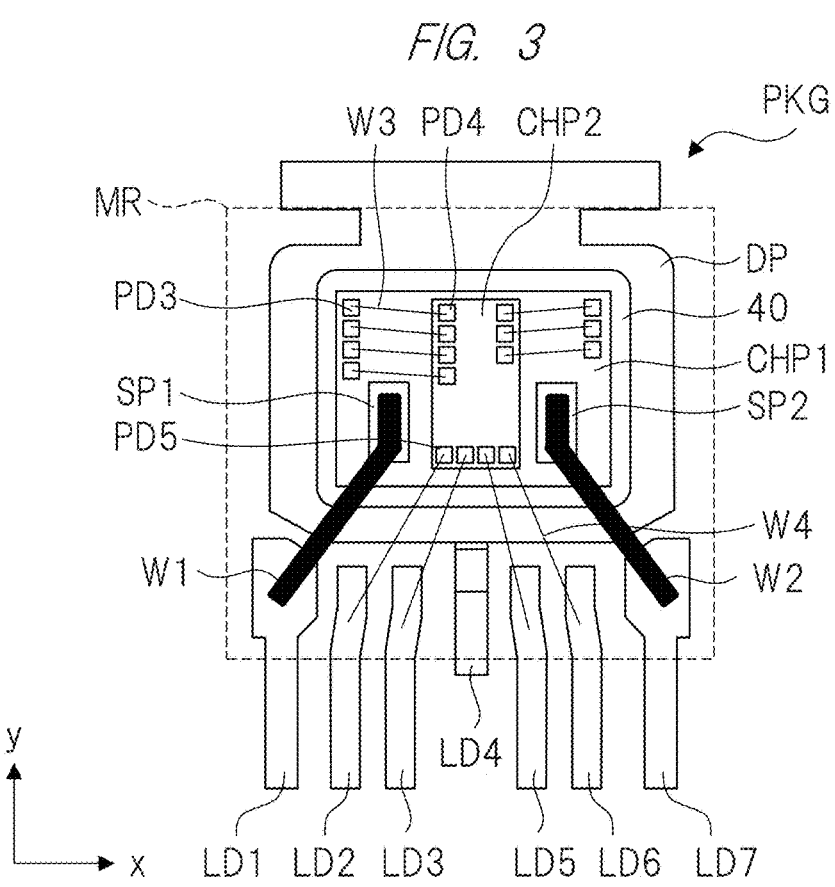
FIG. 3 is a top view of the package structure seen through the sealing body.

FIG. 3 is a top view of the package structure PKG seen through the sealing body MR.

As shown in FIG. 3, the front surface of the semiconductor chip CHP1 has a first region on which a source pad SP1 is formed, a second region on which a source pad SP2 is formed, and a third region sandwiched between the first region and the second region in plan view. The semiconductor chip CHP2 is mounted in the third region with an insulating adhesive material (not shown) interposed therebetween.

The source pad SP1 is connected to the lead LD1 via a bonding wire W1. On the other hand, the source pad SP2 is connected to the lead LD2 via the bonding wire W2. Further, a plurality of pads PD3 is formed on the semiconductor chip CHP1, and a plurality of pads PD4 and a plurality of pads PD5 are formed on the semiconductor chip CHP2. At this time, each of the plurality of pads PD3 is connected to a respective pad PD4 via a bonding wire W3, and each of the plurality of pads PD5 is connected to the lead LD2, the lead LD3, the lead LD5, or the lead LD6 via a bonding wire W4. Moreover, the die pad DP is connected to the lead LD4. Here, a width (and diameter) of each of the bonding wires W1 and W2 is larger than a width (and diameter) of each of the bonding wires W3 and W4.

Figure 4:
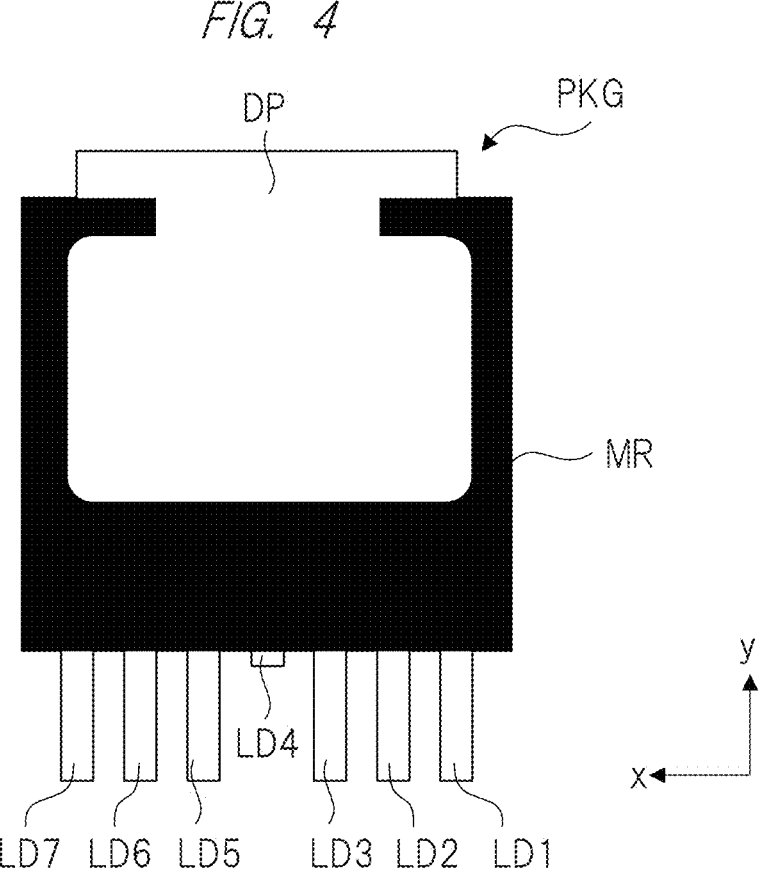
FIG. 4 is a bottom view of the package structure.

FIG. 4 is a bottom view of the package structure PKG.

As shown in FIG. 4, a part of a lower surface of the die pad DP is exposed from a back surface of the sealing body MR, and an outer lead portion of each of the leads LD1 to LD7 protrudes from the sealing body MR. Thus, the package structure PKG is configured as described above.

<Method of Manufacturing Semiconductor Device>

Next, an assembly process of the package structure (semiconductor device) PKG1 will be described.

Figure 5:
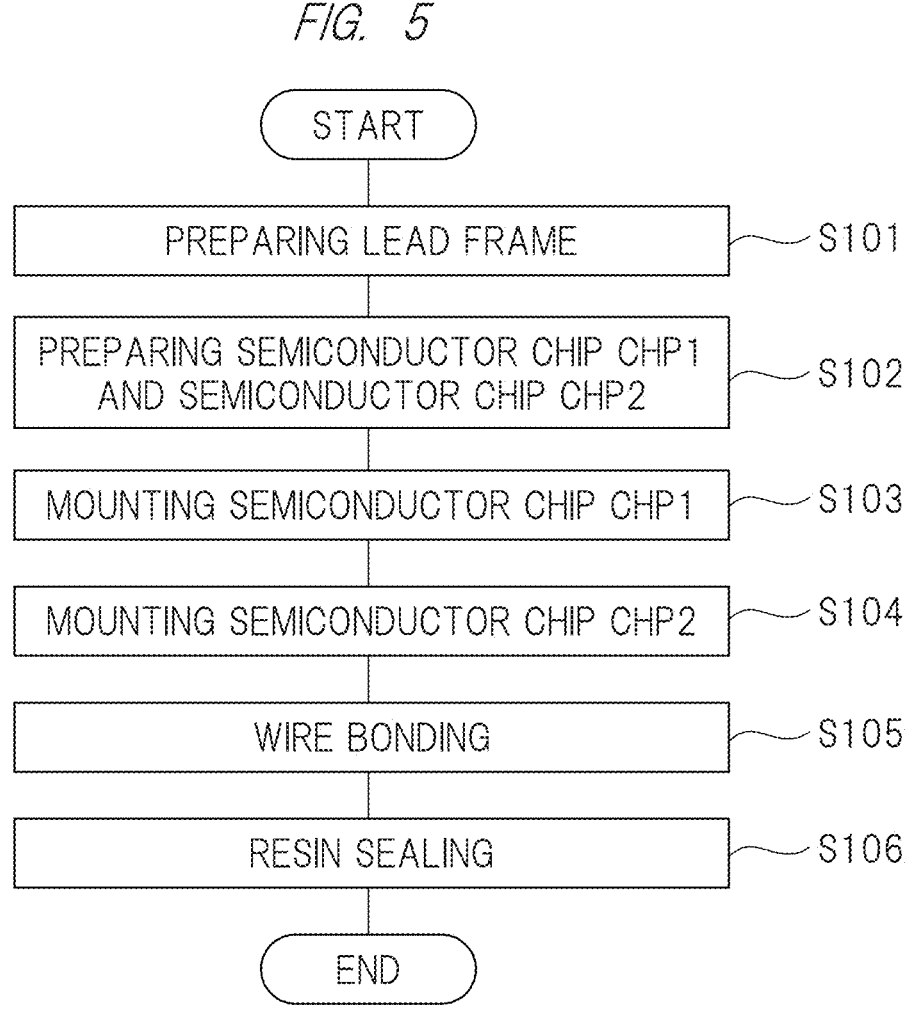
FIG. 5 is a flowchart describing an assembly process of the package structure.

FIG. 5 is a flowchart describing the assembly process of the package structure PKG1.

First, a lead frame having the die pad DP and the leads LD is prepared (S101). Moreover, the semiconductor chip CHP1 having a main surface, a pad formed on the main surface, and an insulating film formed on the main surface is prepared. Likewise, the semiconductor chip CHP2 having a main surface, a pad formed on the main surface, and an insulating film formed on the main surface is prepared (S102).

Then, the semiconductor chip CHP1 on which the power transistor is formed is mounted on the die pad DP. Specifically, after the conductive adhesive material 40 made of solder, silver paste or the like is applied onto the die pad DP, the semiconductor chip CHP1 is mounted on the die pad DP with the conductive adhesive material 40 interposed therebetween (S103).

Next, the semiconductor chip CHP2 on which the control circuit is formed is mounted on the semiconductor chip CHP1. Specifically, after the insulating adhesive material is disposed on the third region sandwiched between the first region on which the source pad SP1 of the semiconductor chip CHP1 is formed and the second region on which the source pad SP2 of the semiconductor chip CHP1 is formed, the second semiconductor chip is mounted on the first semiconductor chip with the insulating adhesive material interposed therebetween (S104).

Thereafter, the source pad SP1 formed on the semiconductor chip CHP1 and the lead LD1 are connected to each other by the bonding wire W1, and the source pad SP2 formed on the semiconductor chip CHP1 and the lead LD7 are connected to each other by the bonding wire W2. Further, each pad PD3 formed on the semiconductor chip CHP1 and the respective pad PD4 formed on the semiconductor chip CHP2 are connected to each other by the bonding wire W3, and each pad PD5 formed on the semiconductor chip CHP2 and the respective lead LD (lead LD2, LD3, LD5, or LD6) are connected to each other by the bonding wire W4 (S105).

Subsequently, resin sealing (molding) is performed, so that the sealing body MR is formed (S106). Then, a plating layer is formed as necessary on each outer lead portion of the lead LD exposed from the sealing body MR. Next, the lead LD outside of the sealing body MR is cut at a predetermined position, so that the sealing body MR is separated from a frame of the lead frame. Subsequently, each outer lead portion of the lead LD protruding from the sealing body MR is subjected to a bending process. Thus, the package structure PKG1 can be manufactured as described above.

<Wire Bonding Process>

Hereinafter, attention is paid to a wire bonding process.

Figure 6:
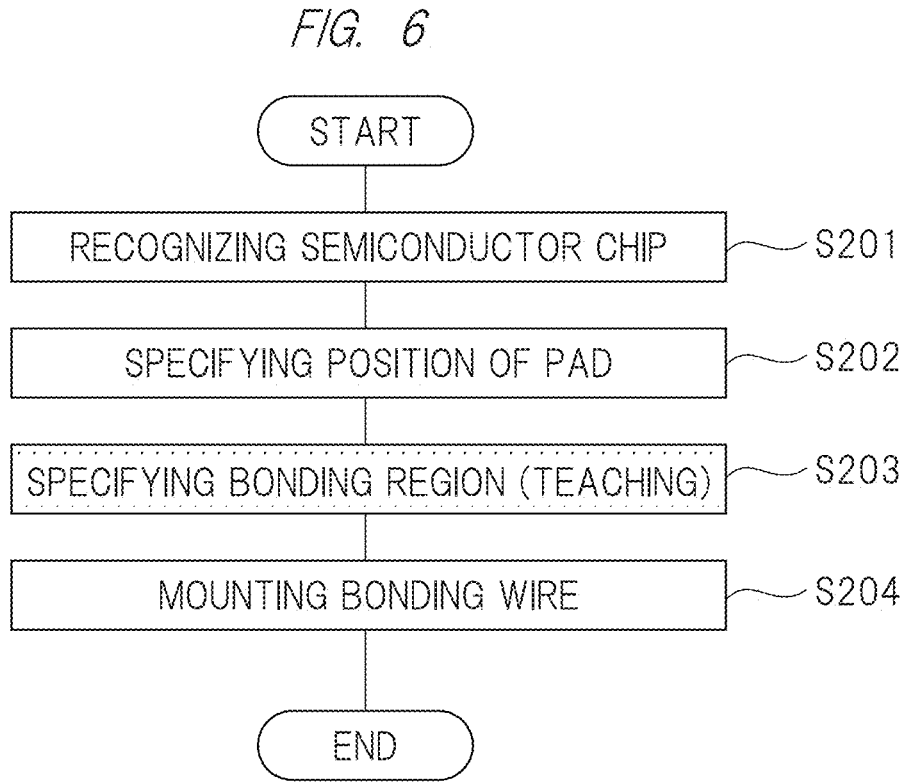
FIG. 6 is a flowchart describing details of a wire bonding process.

FIG. 6 is a flowchart describing details of the wire bonding process.

As shown in FIG. 6, in the wire bonding process, first, a unique pattern present in the semiconductor chip is recognized by a camera (imaging unit) provided in the wire bonding apparatus, so that the semiconductor chip is recognized (S201). Next, the unique pattern is used as a point of origin, so that a position of the pad formed on the semiconductor chip is specified based on coordinate data of the pad acquired in advance (S202). Thereafter, in a part of the pad exposed in an opening portion formed in the insulating film, a process to specify a bonding region for connecting the bonding wire is performed (S203). This process to specify the bonding region is called "teaching". From a viewpoint of suppressing characteristic fluctuations of the semiconductor device caused by misalignment of the bonding position to which the bonding wire is connected, this "teaching" is performed in order to accurately specify the bonding region of the pad to which the bonding wire is connected. Subsequently, based on information specified by the "teaching", a process to connect the bonding wire to the bonding region of the pad is performed by using a bonding tool of the wire bonding apparatus (S202). In this manner, the wire bonding process is performed.

At this time, in order to suppress characteristic fluctuations of the semiconductor device caused by misalignment of the bonding position, it is important to accurately specify the bonding region of the pad by the "teaching". In this regard, according to studies by the present inventor, it was found that the current "teaching" allows for room for improvement from the viewpoint of accurately specifying the bonding region of the pad. Accordingly, in the following, descriptions of the related art related to the "teaching" will be followed by descriptions of room for improvement present in the related art.

DESCRIPTIONS OF RELATED ART

The "related art" mentioned in this specification is not a commonly known technique, but is a technique having the problem found by the present inventor, and is a prerequisite technique for the present invention.

FIG. 7 is a diagram describing the "teaching" in the related art.

As shown in FIG. 7, first, the semiconductor device having the pad PD is transported onto a bond stage of the wire bonding apparatus, so that the pad PD is disposed directly below the camera. Thus, an image of the pad PD taken by the camera is displayed on a monitor of the wire bonding apparatus. FIG. 7 shows the image of the pad PD displayed on the monitor. For example, a planar shape of the pad PD is a rectangle shape having long sides and short sides, where a length of each long side is approximately 1000 μm, and a length of each short side is approximately 600 μm.

Next, an operator views the image displayed on the monitor, moves the camera to have the bonding region BR come to a center of the image, visually adjusts the position, and thereafter, specifies the bonding region BR. Specifically, as shown in FIG. 7, crosshairs constituted by a horizontal line 500A and a vertical line 500B are displayed on the monitor, and the bonding region BR is specified based on the crosshairs. In detail, scales are marked at predetermined intervals on each of the horizontal line 500A and the vertical line 500B, a center of the crosshairs is moved to the vicinity of a center of the pad PD, and a center position of the crosshairs is adjusted such that the number of scales from the center of the crosshairs to the respective upper, lower, right, and left sides of the pad PD become the same. For example, the interval between the scales marked on each of the horizontal line 500A and the vertical line 500B constituting the crosshairs is approximately 100 μm.

Thus, the "teaching" in the related art is performed as described above.

<Room for Improvement>

However, dimensions (width and length) of the pad PD to which the bonding wires are connected vary depending on the type of semiconductor device. As a result, the dimensions of the pad PD may not be an integer multiple of the scale interval marked on each of the horizontal line 500A and the vertical line 500B constituting the crosshairs of the wire bonding apparatus used. In such a case, it is necessary for an operator to visually confirm the amount of "1 scale× integer+α scale (where a is a decimal number), and align an intersection point of the crosshairs with the center of the pad PD. At this time, it would be difficult for the operator to accurately adjust the center position of the crosshairs such that the amount of "1 scale×integer+α scale" becomes the same from the center of the crosshairs to the respective upper, lower, right, and left sides of the pad PD. Therefore, in the related art, for example, a deviation of approximately 10% (several tens of micrometers) per scale occurs at the time of specifying the bonding region BR.

Hence, in the "teaching" in the related art, there is a risk that characteristic fluctuations of the semiconductor device caused by misalignment of the bonding position would become apparent. Particularly, for example, in a case where it is assumed that the bonding wire is connected to the source pad of the semiconductor device comprising the sense transistor, current detection precision by the sense transistor significantly fluctuates by misalignment of the bonding position. Therefore, in the semiconductor device comprising the sense transistor, it is necessary to improve misalignment of the bonding position so as to be smaller than that of the related art from the viewpoint of ensuring current detection precision by the sense transistor.

Accordingly, in the present embodiment, a device has been devised to overcome the room for improvement present in the related art. Hereinafter, a technical concept of the present embodiment with such an improvement will be described.

<Fundamental Concept of the Embodiment>

The fundamental concept is to specify, without relying on the scales marked on each of the horizontal line and the vertical line constituting the crosshairs displayed on the monitor of the wire bonding apparatus, the bonding region based on the intersection point of the crosshairs automatically adjusted by having the horizontal line partially constituting the crosshairs superimposed on a first marker, and having the vertical line partially constituting the crosshairs superimposed on a second marker.

More specifically, the fundamental concept of the present embodiment is to form an opening in the insulating film that exposes the pad or a part of the pad, and provide a marker on each of the two sides that intersect each other. Based on the above premise, the concept is one in which the bonding region is specified by having the horizontal line partially constituting the crosshairs displayed on the monitor of the wire bonding apparatus superimposed on a line segment constituting a part of the first marker provided on one of the two sides, and having the vertical line partially constituting the crosshairs displayed on the monitor of the wire bonding apparatus superimposed on a line segment constituting a part the second marker provided on the other of the two sides.

In more detail, the fundamental concept of the present embodiment is based on a premise that, in the pad exposed in the opening portion formed in the insulating film, a first side of the pad having a quadrangular planar shape or a first side of the opening portion having a quadrangular planar shape is provided with the first marker, and a second side intersecting the first side of the pad or the first side of the opening portion is provided with the second marker. The fundamental concept is also based on the premise that the first marker has a first line segment orthogonal to the first side at a first position of the first side, and the second marker has a first line segment orthogonal to the second side at a first position of the second side. Based on the above, the fundamental concept of the present embodiment is one in which the bonding region is specified by having the horizontal line partially constituting the crosshairs displayed on the monitor of the wire bonding apparatus superimposed on the first line segment of the first marker, and having the vertical line partially constituting the crosshairs superimposed on the first line segment of the second marker.

Hereinafter, this fundamental concept will be described with reference to the drawings.

Figure 8:
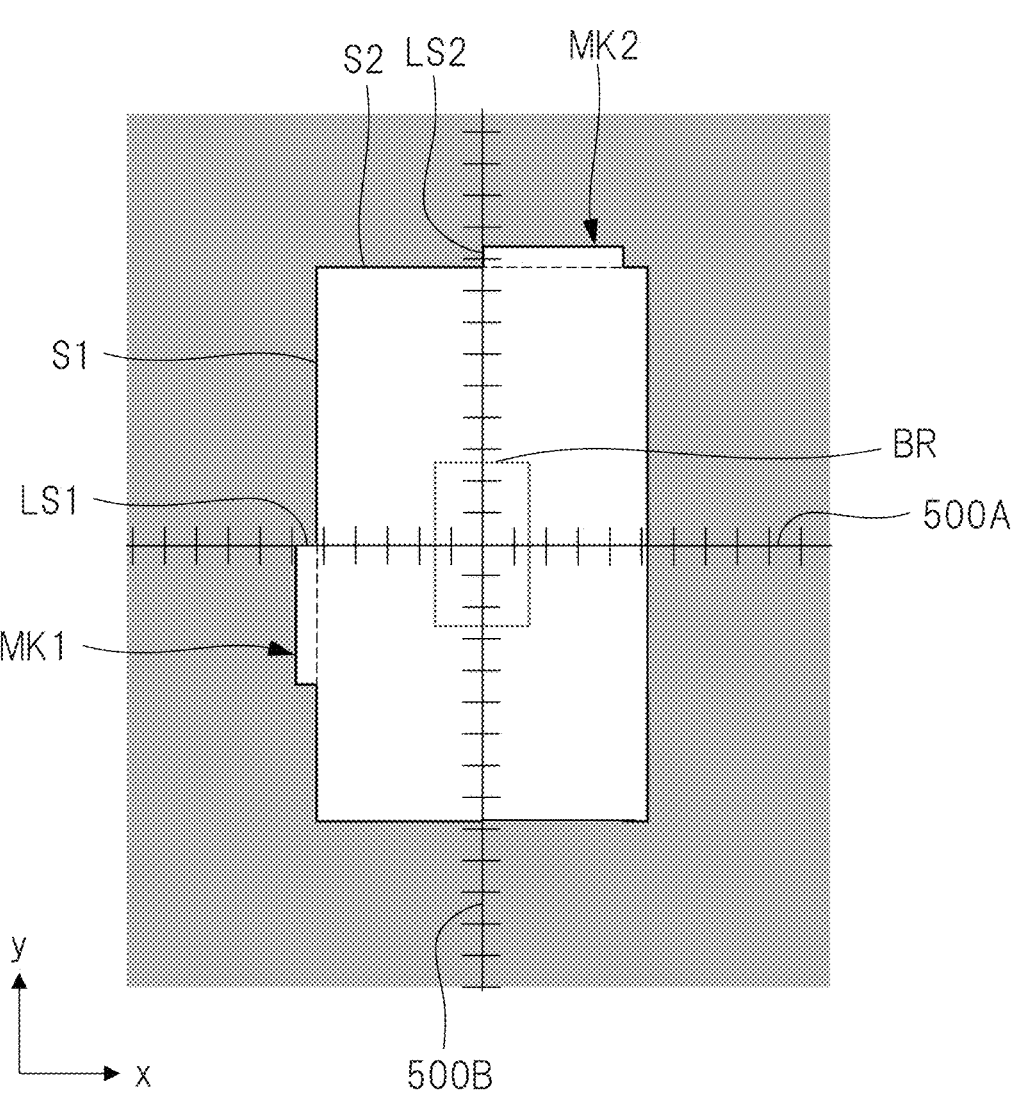
FIG. 8 is a diagram describing a fundamental concept.

FIG. 8 is a diagram describing the fundamental concept.

FIG. 8 shows an image of the opening portion formed in the pad or the insulating film in the fundamental concept and displayed on the monitor of the wire bonding apparatus. Specifically, FIG. 8 shows the pad having a quadrangular planar shape or the opening portion having a quadrangular planar shape. The pad or the opening portion has a first side S1 and a second side S2 intersecting the first side S1. Here, the first side S1 is provided with a first marker MK1 made of a protrusion, and the second side S2 is provided with a second marker MK2 made of a protrusion. At this time, the first marker MK1 has a first line segment LS1 (side) orthogonal to the first side S1 at a first position (midpoint) of the first side S1. Moreover, the second marker MK2 has a first line segment LS2 (side) orthogonal to the second side S2 at a first position (midpoint) of the second side S2.

Further, FIG. 8 shows the crosshairs having the horizontal line 500A and the vertical line 500B.

As shown in FIG. 8, in the fundamental concept, the bonding region BR is specified by having the horizontal line 500A partially constituting the crosshairs displayed on the monitor of the wire bonding apparatus superimposed on the first line segment LS1 of the first marker MK1, and having the vertical line 500B partially constituting the crosshairs superimposed on the first line segment LS2 of the second marker MK2.

Thus, according to the fundamental concept, without relying on the scales marked on each of the horizontal line 500A and the vertical line 500B constituting the crosshairs, simply having the horizontal line 500A partially constituting the crosshairs superimposed on the first line segment LS1 of the first marker MK1, and having the vertical line 500B partially constituting the crosshairs superimposed on the first line segment LS2 of the second marker MK2 will inevitably result in the intersection point of the crosshairs to be located in a central region of the opening portion formed in the pad or the insulating film.

As a result, according to the fundamental concept, the bonding region of the pad to which the bonding wire is connected can be accurately specified. Therefore, according to the fundamental concept, characteristic fluctuations of the semiconductor device caused by misalignment of the bonding position can be suppressed.

Particularly, for example, in a case where the bonding wire is connected to the source pad of the semiconductor device including the sense transistor, current detection precision by the sense transistor significantly fluctuates when misalignment of the bonding position occurs. In this regard, according to the fundamental concept, the bonding region can be accurately specified, whereby misalignment of the bonding position can be reduced to ensure current detection precision by the sense transistor.

Figure 9:
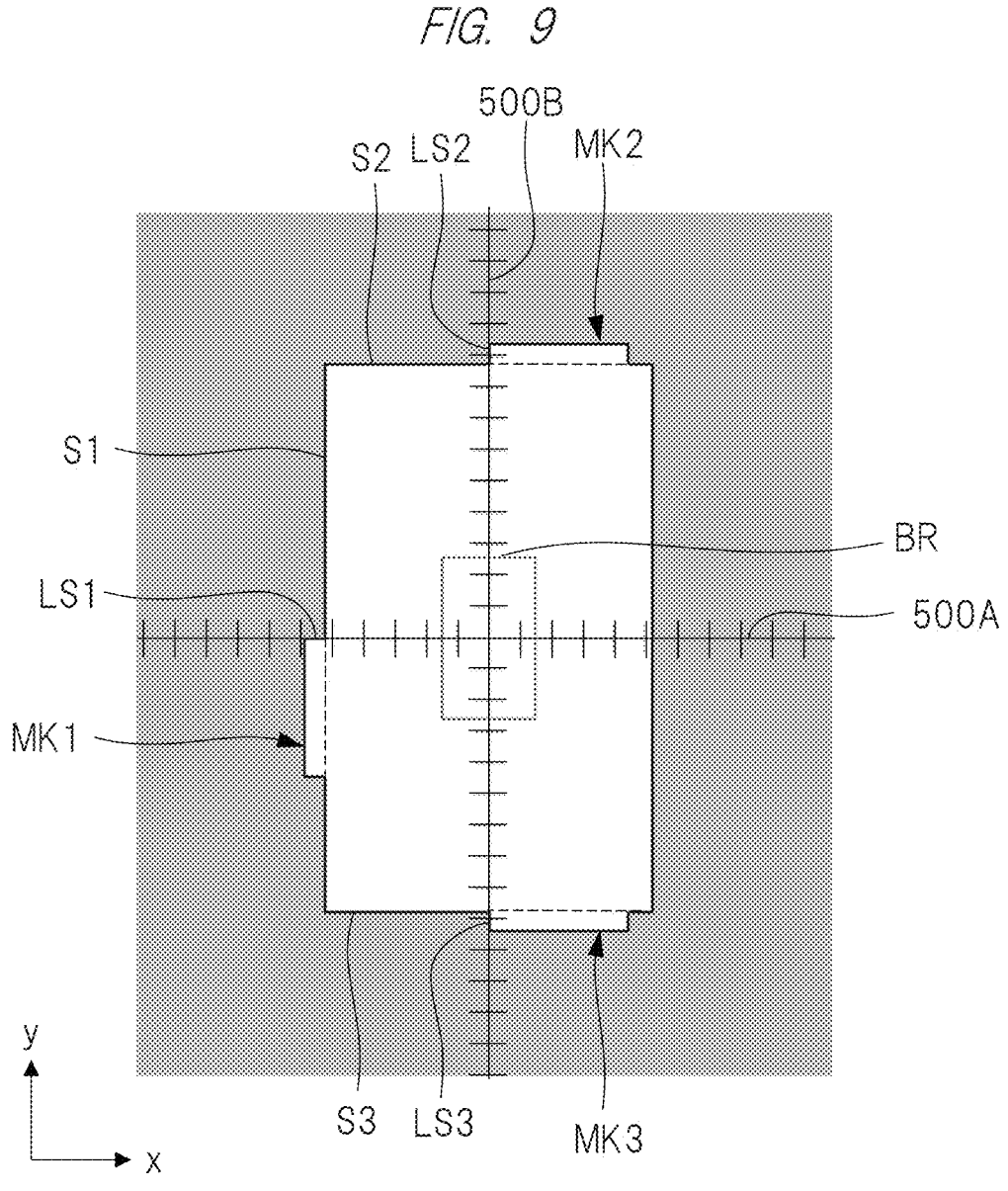
FIG. 9 is a diagram describing a fundamental concept in a case where rotational misalignment is considered.

Note that, in order to achieve the fundamental concept, it is sufficient to provide the markers on at least two intersecting sides among the four sides of the pad or the opening portion. However, in a case where a correction on rotational misalignment (theta misalignment) of the pad or the opening portion is also considered, it is necessary that at least three sides among the four sides of the pad or the opening portion are each provided with the marker as shown in, for example, FIG. 9. Specifically, as shown in FIG. 9, the pad or the opening portion further has a third side S3 intersecting the first side S1 of the pad or the first side S1 of the opening portion and facing the second side S2 of the pad or the second side S2 of the opening portion, and the third side S3 of the pad or the third side S3 of the opening portion is further provided with a third marker MK3. Here, the third marker MK3 has a first line segment LS3 (side) orthogonal to the third side S3 at a first position (midpoint) of the third side S3. In this case, the fundamental concept is to specify the bonding region BR by having the horizontal line 500A partially constituting the crosshairs superimposed on the first line segment LS1 of the first marker MK1, and having the vertical line 500B partially constituting the crosshairs superimposed on each of the first line segment LS2 of the second marker MK2 and the first line segment LS3 of the third marker MK3. Thus, rotational misalignment (theta misalignment) of the pad or the opening portion can also be corrected.

Next, an implementation in which the above-described fundamental concept is achieved will be described.

<Implementation>

<<Cross-Sectional Structure of the Pad>>

Figure 10:
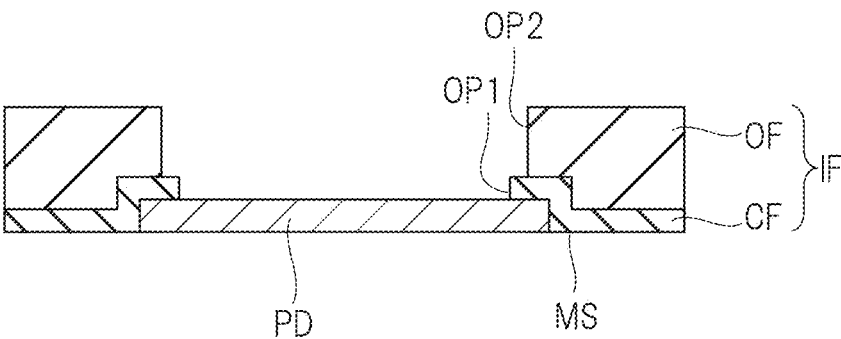
FIG. 10 is a cross-sectional view showing a pad structure.

FIG. 10 is a cross-sectional view showing a pad structure.

On a main surface MS of the semiconductor chip, there are formed, for example, a pad PD made of aluminum or an aluminum alloy, and an insulating film IF formed so as to cover the pad PD. The insulating film IF is comprised of a laminated film including, for example, a cover film CF constituted by an inorganic insulating film such as a silicon nitride film, and an organic insulating film OF such as a polyimide resin film. Here, the opening portion exposing a part of the front surface of the pad PD is formed in the insulating film IF. Specifically, a first opening portion OP1 is formed in the cover film CF partially constituting the insulating film IF, and a second opening portion OP2 is formed in the organic insulating film OF partially constituting the insulating film IF. At this time, an opening size of the second opening portion OP2 is set to be larger than an opening size of the first opening portion OP1. Thus, the pad structure is configured as described above.

<<Plane Structure of the Pad>>

Figures 11A, 11B, 11C:
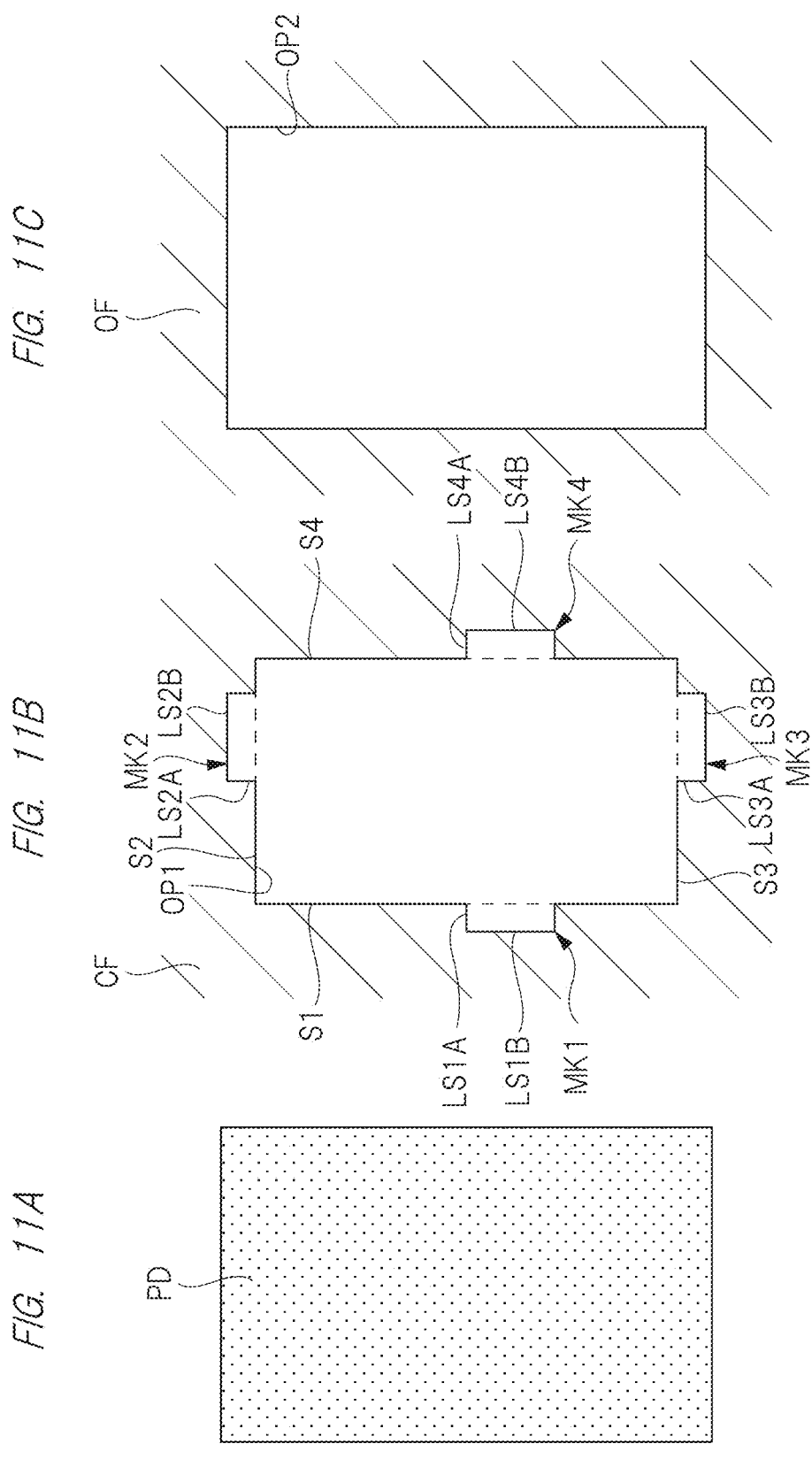
FIGS. 11A to 11C are diagrams in an implementation, where

FIGS. 11A to 11C are plan views showing the pad structure. Particularly, FIG. 11A is a plan view showing a planar shape of the pad PD, FIG. 11B is a plan view showing a planar shape of the opening portion OP1 formed in the cover film CF, and FIG. 11C is a plan view showing a planar shape of the opening portion OP2 formed in the organic insulating film OF.

As shown in FIG. 11A, the planar shape of the pad PD has a quadrangular shape. As shown in FIG. 11B, the planar shape of the opening portion OP1 formed in the cover film CF has a quadrangular shape including the first side S1, the second side intersecting the first side S1, the third side S3 intersecting the first side S1 and facing the second side, and a fourth side S4 facing the first side S1. In the implementation, the first side S1 of the opening portion OP1 is provided with the first marker MK1, and the second side S2 of the opening portion OP1 is provided with the second marker MK2. In addition, in the implementation, the third side S3 of the opening portion OP1 is provided with the third marker MK3, and the fourth side S4 of the opening portion OP1 is provided with a fourth marker MK4.

Here, the first marker MK1 has a first line segment LS1A orthogonal to the first side S1 at the first position (midpoint) of the first side S1, and a second line segment LS1B intersecting the first line segment LS1A and extending along the first side S1. Moreover, the second marker MK2 has a first line segment LS2A orthogonal to the second side S2 at the first position (midpoint) of the second side S2, and a second line segment LS2B intersecting the first line segment LS2A and extending along the second side S2. Further, the third marker MK3 has a first line segment LS3A orthogonal to the third side S3 at the first position (midpoint) of the third side S3, and a second line segment LS3B intersecting the first line segment LS3A and extending along the third side S3. Moreover, the fourth marker MK4 has a first line segment LS4A orthogonal to the fourth side S4 at the first position (midpoint) of the fourth side S4, and a second line segment LS4B intersecting the first line segment LS4A and extending along the fourth side S4.

As shown in FIG. 11C, a planar shape of the opening portion OP2 formed in the organic insulating film OF has a quadrangular shape. Thus, the pad structure is configured as described above.

In the implementation, the "teaching" described in the fundamental concept is performed based on the pad structure shown in FIGS. 11A to 11C.

That is, in the implementation, the bonding region BR is specified by having the horizontal line partially constituting the crosshairs displayed on the monitor of the wire bonding apparatus superimposed on the first line segment LS1A of the first marker MK1 provided on the first side S1 of the opening portion OP1, having the vertical line partially constituting the crosshairs superimposed on the first line segment LS2A of the second marker MK2 provided on the second side S2 of the opening portion OP1, having the horizontal line superimposed on the first line segment LS4A of the fourth marker MK4 provided on the third side S4 of the opening portion OP1, and having the vertical line superimposed on the first line segment LS3A of the third marker MK3 provided on the third side S3 of the opening portion OP1.

Here, in the implementation, the opening portion OP1 formed in the cover film CF is provided with markers, and the reason for this will be described. For example, the marker may be provided on the pad PD. However, in a case where the pad PD is made of an aluminum film or an aluminum alloy film, precision of forming a right-angle pattern is not good, and a right-angle shape would become a round shape. Therefore, in a case where the pad PD is provided with the marker, precision of the line segment composing the marker is not high. Moreover, the marker may be provided on the opening portion OP2 formed in the organic insulating film OF. However, a removal amount (retreat amount) by etching at the time of forming the opening portion OP2 in the organic insulating film (polyimide resin film) OF is apt to be larger than a removal amount (retreat amount) by etching at the time of forming the opening portion in the inorganic insulating film. Therefore, in a case where the opening portion OP2 formed in the organic insulating film OF is provided with the marker, processing precision of the marker is not high. Hence, in a case where a high processing precision of the marker (that is, high precision of the line segment constituting the marker) is considered, it is preferable that the opening portion OP1 formed in the cover film CF is provided with the marker as in the implementation.

First Modified Example

Figure 12:
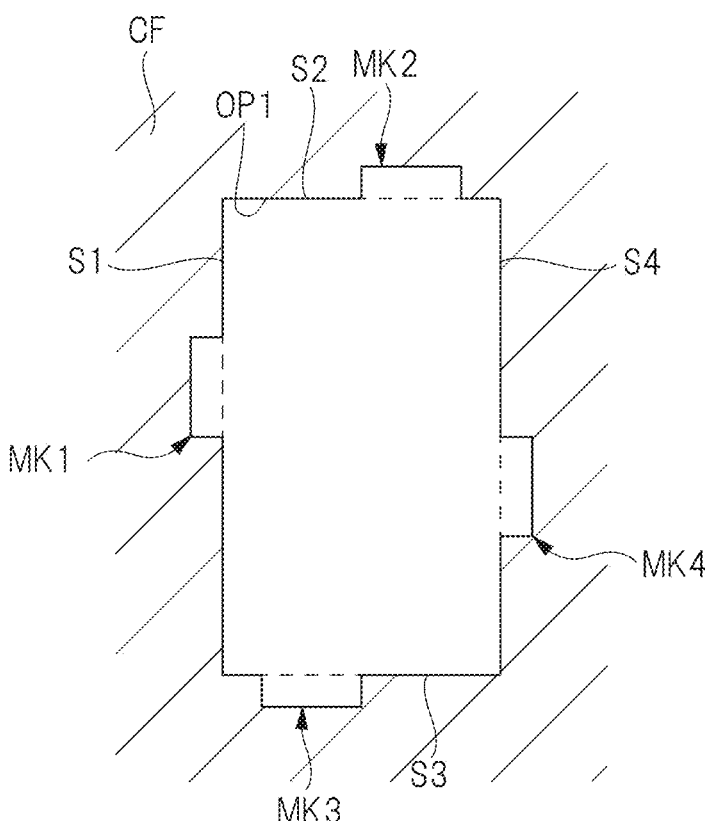
FIG. 12 is a plan view showing a pad structure in a first modified example.

FIG. 12 is a plan view showing a pad structure in a first modified example.

In the implementation shown in FIG. 11B, the first marker MK1 and the fourth marker MK4 are arranged in line symmetry with respect to a vertical centerline that passes through a center of the opening portion OP1, and the second marker MK2 and the third marker MK3 are arranged in line symmetry with respect to a horizontal centerline that passes through the center of the opening portion OP1. However, as shown in FIG. 12, the first marker MK1 and the fourth marker MK4 may be arranged in point symmetry with respect to the center of the opening portion OP1, and the second marker MK2 and the third marker MK3 may be arranged in point symmetry with respect to the center of the opening portion OP1.

Second Modified Example

Figures 13A, 13B, 13C:
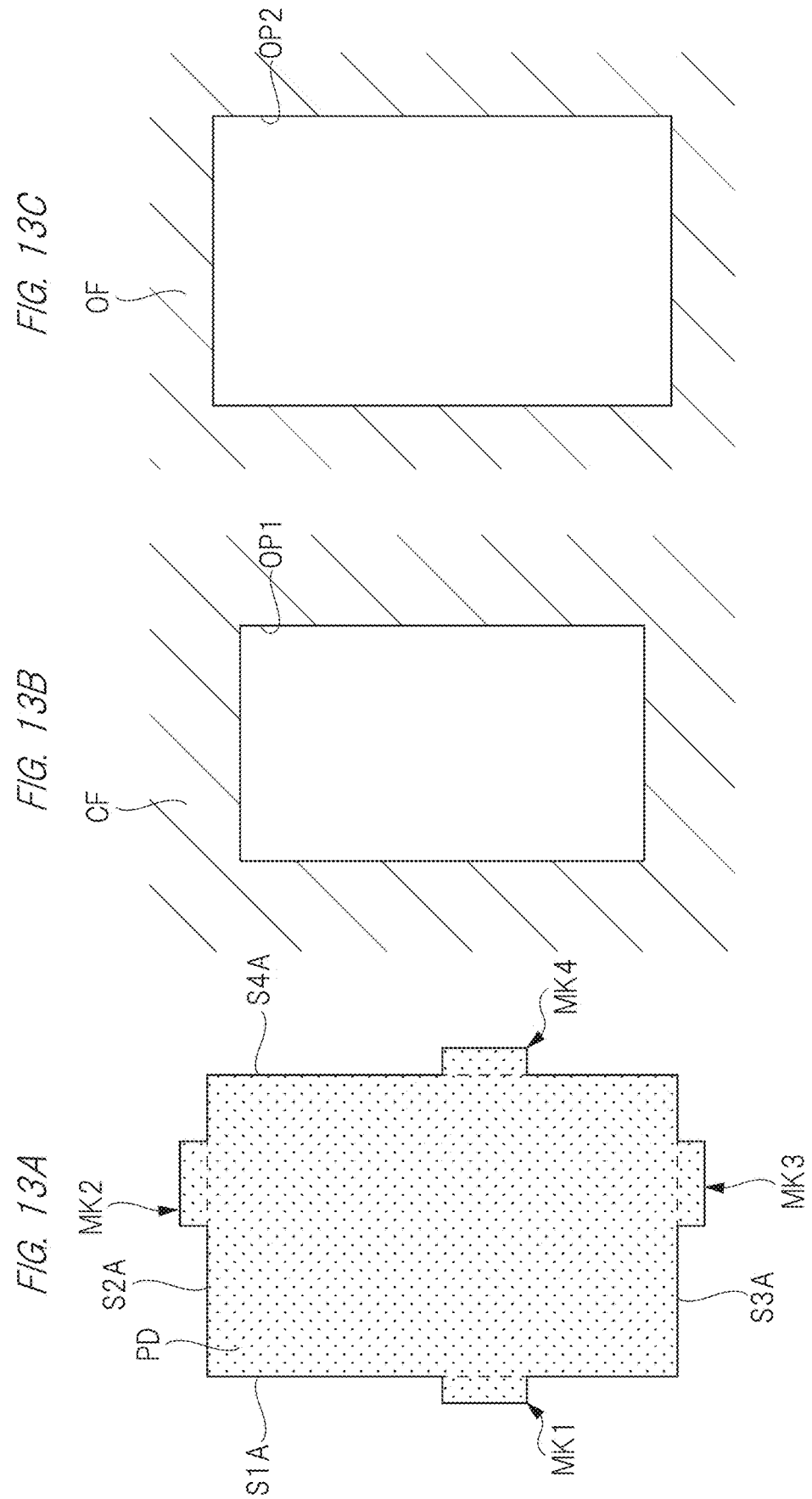
FIGS. 13A to 13C are diagrams each showing a pad structure in a second modified example, where

FIGS. 13A to 13C are plan views showing a pad structure in a second modified example. Particularly, FIG. 13A is a plan view showing a planar shape of the pad PD, FIG. 13B is a plan view showing a planar shape of the opening portion OP1 formed in the cover film CF, and FIG. 13C is a plan view showing a planar shape of the opening portion OP2 formed in the organic insulating film OF.

As shown in FIG. 13A, in the second modified example, the pad PD is provided with markers. Specifically, the planar shape of the pad PD has a quadrangular shape including a first side S1A, a second side S2A intersecting the first side S1A, a third side S3A intersecting the first side S1A and facing the second side S2A, and a fourth side S4A facing the first side S1A. In the second modified example, the first side S1A of the pad PD is provided with the first marker MK1, and the second side S2A of the pad PD is provided with the second marker MK2. Moreover, in the second modified example, the third side S3A of the pad PD is provided with the third marker MK3, and the fourth side S4A of the pad PD is provided with the fourth marker MK4. Thus, the pad PD may be provided with the markers as described above.

Third Modified Example

FIGS. 14A to 14C are plan views showing a pad structure in a third modified example. Particularly, FIG. 14A is a plan view showing a planar shape of the pad PD, FIG. 14B is a plan view showing a planar shape of the opening portion OP1 formed in the cover film CF, and FIG. 14C is a plan view showing a planar shape of the opening portion OP2 formed in the organic insulating film OF.

As shown in FIG. 14C, in the third modified example, the opening portion OP2 formed in the organic insulating film OF is provided with markers. Specifically, the planar shape of the opening portion OP2 has a quadrangular shape including a first side S1B, a second side S2B intersecting the first side S1B, a third side S3B intersecting the first side S1B and facing the second side S2B, and a fourth side S4B facing the first side S1B. In the third modified example, the first side S1B of the opening portion OP2 is provided with the first marker MK1, and the second side S2B of the opening portion OP2 is provided with the second marker MK2. Further, in the second modified example, the third side S3B of the opening portion OP2 is provided with the third marker MK3, and the fourth side S4B of the opening portion OP2 is provided with the fourth marker MK4.

Thus, the opening portion OP2 formed in the organic insulating film OF may be provided with the markers as described above.

Fourth Modified Example

Figures 15A, 15B, 15C:
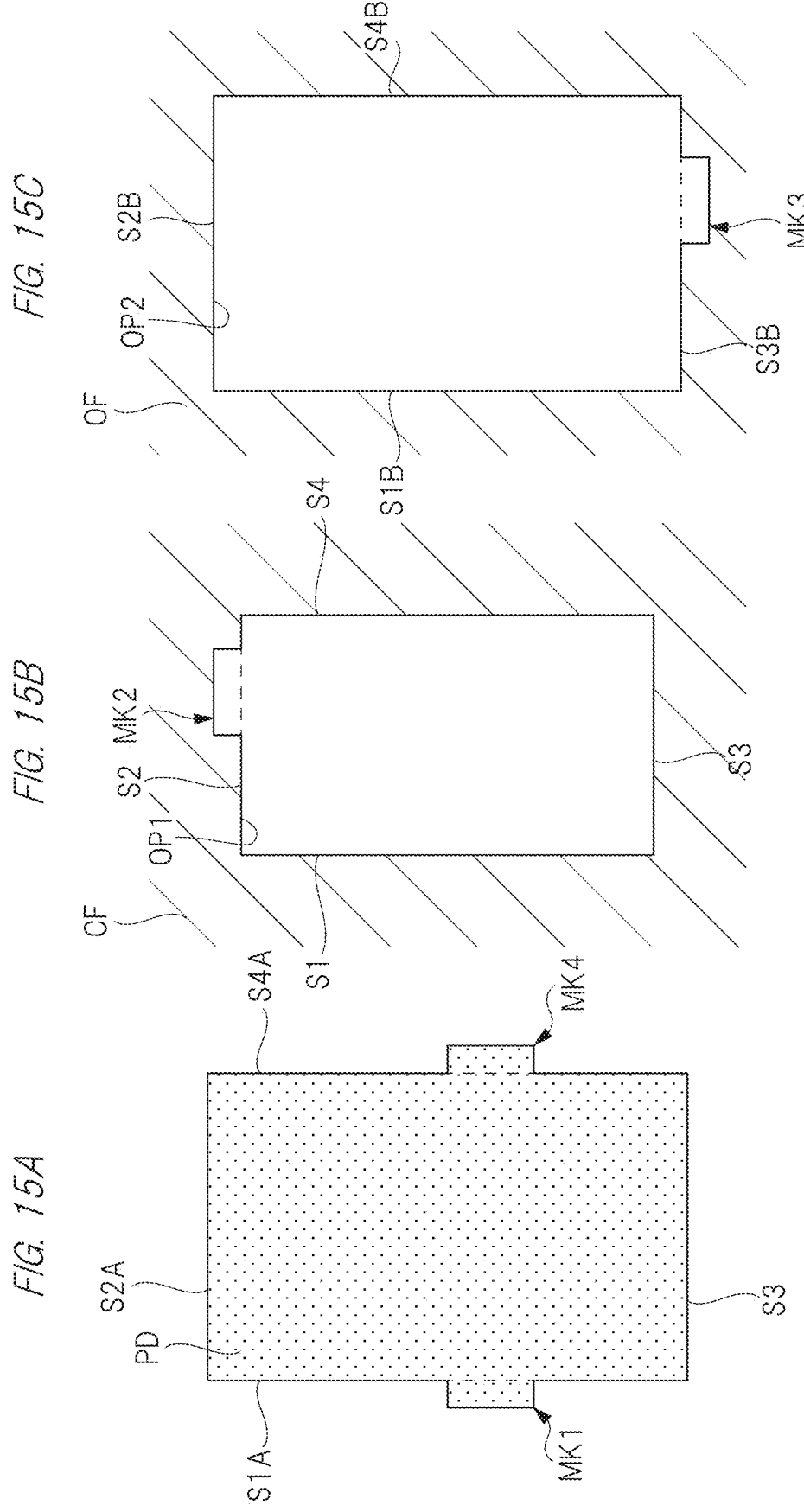
FIGS. 15A to 15C are diagrams each showing a pad structure in a fourth modified example, where

FIGS. 15A to 15C are plan views showing a pad structure in a fourth modified example. Particularly, FIG. 15A is a plan view showing a planar shape of the pad PD, FIG. 15B is a plan view showing a planar shape of the opening portion OP1 formed in the cover film CF, and FIG. 15C is a plan view showing a planar shape of the opening portion OP2 formed in the organic insulating film OF.

As shown in FIGS. 15A to 15C, in the fourth modified example, the pad PD, the opening portion OP1 formed in the cover film CF, and the opening portion OP2 formed in the organic insulating film OF are provided with markers. Specifically, the planar shape of the pad PD has a quadrangular shape including the first side S1A, the second side S2A intersecting the first side S1A, the third side S3A intersecting the first side S1A and facing the second side S2A, and the fourth side S4A facing the first side S1A. In the fourth modified example, the first side S1A of the pad PD is provided with the first marker MK1, and the fourth side S4A of the pad PD is provided with the fourth marker MK4.

Moreover, the planar shape of the opening portion OP1 formed in the cover film CF has a quadrangular shape including the first side S1, the second side S2 intersecting the first side S1, the third side S3 intersecting the first side S1 and facing the second side S2, and the fourth side S4 facing the first side S1. In the fourth modified example, the second side S2 of the opening portion OP1 is provided with the second marker MK2.

Further, the planar shape of the opening portion OP2 formed in the organic insulating film OF has a quadrangular shape including the first side S1B, the second side S2B intersecting the first side S1B, the third side S3B intersecting the first side S1B and facing the second side S2B, and the fourth side S4B facing the first side S1B. In the fourth modified example, the third side S3B of the opening portion OP2 is provided with the third marker MK3.

Thus, the plurality of markers (first marker MK1 to fourth marker MK4) may be separately provided on the pad PD, the opening portion OP1 formed in the cover film CF, and the opening portion OP2 formed in the organic insulating film OF.

<<Main Constituent of "Teaching">>

(1) Main Constituent: Wire Bonding Apparatus

In the "teaching" that achieves the fundamental concept, the bonding region BR is specified by having the horizontal line 500A partially constituting the crosshairs displayed on the monitor of the wire bonding apparatus superimposed on the first line segment LS1 of the first marker MK1, and having the vertical line 500B partially constituting the crosshairs superimposed on the first line segment LS2 of the second marker MK2 as shown in, for example, FIG. 8.

The main constituent of this "teaching" is the wire bonding apparatus. That is, the wire bonding apparatus specifies the bonding region BR by having the horizontal line 500A superimposed on the first line segment LS1 of the first marker MK1, and having the vertical line 500B superimposed on the first line segment LS2 of the second marker MK2. Thus, the wire bonding apparatus performs the "teaching" that automatically achieves the fundamental concept, whereby the bonding region BR can be accurately specified without intervention by the operator. As a result, misalignment of the bonding position to which the bonding wire is connected can be automatically suppressed by the wire bonding apparatus, whereby characteristic fluctuations of the semiconductor device caused by misalignment can be suppressed.

Hereinafter, a configuration for achieving the fundamental concept of the "teaching" achieved by the wire bonding apparatus will be described.

Figure 16:
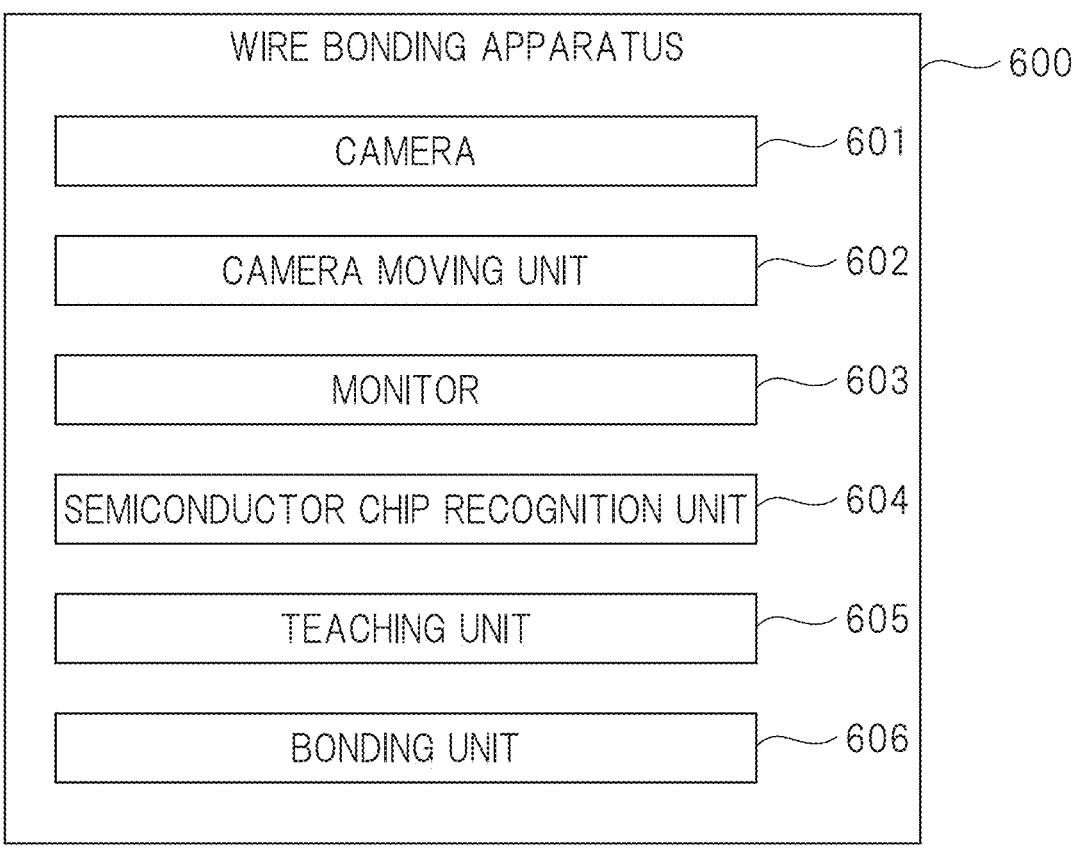
FIG. 16 is a block diagram showing a schematic configuration of a wire bonding apparatus.

FIG. 16 is a block diagram showing a schematic configuration of the wire bonding apparatus.

In FIG. 16, the wire bonding apparatus has a camera 601, a camera moving unit 602, a monitor 603, a semiconductor chip recognition unit 604, a teaching unit 605, and a bonding unit 606.

The camera 601 is configured to take an image of the semiconductor device transported onto the stage, and is configured such that a position thereof is movable by the camera moving unit 602. Moreover, the image taken by the camera 601 is displayed on the monitor 603. The image taken by the camera 601 and, for example, crosshairs shown in FIG. 8 are also displayed on the monitor 603.

The semiconductor chip recognition unit 604 is configured to recognize the semiconductor chip based on the image taken by the camera 601 and displayed on the monitor 603. For example, the semiconductor chip recognition unit 604 is configured to recognize the semiconductor chip by specifying a unique pattern from the image displayed on the monitor 603. Here, for example, a gate pad or the like formed on the front surface of the semiconductor chip is used as the unique pattern. In addition, the semiconductor chip recognition unit 604 is configured to use the position of the unique pattern as a point of origin to specify the pad (source pad) based on coordinate data acquired in advance.

The teaching unit 605 is configured to specify the bonding region serving as a position at which the bonding wire is connected to the pad by superimposing the marker provided on the pad or the opening portion open to the pad on the crosshairs.

The bonding unit 606 is configured to connect the bonding wire to the bonding region of the pad by, for example, operating a bonding tool based on information regarding the bonding region specified by the teaching unit 605.

Next, a configuration of the teaching unit 605 will be described in detail.

Figure 17:
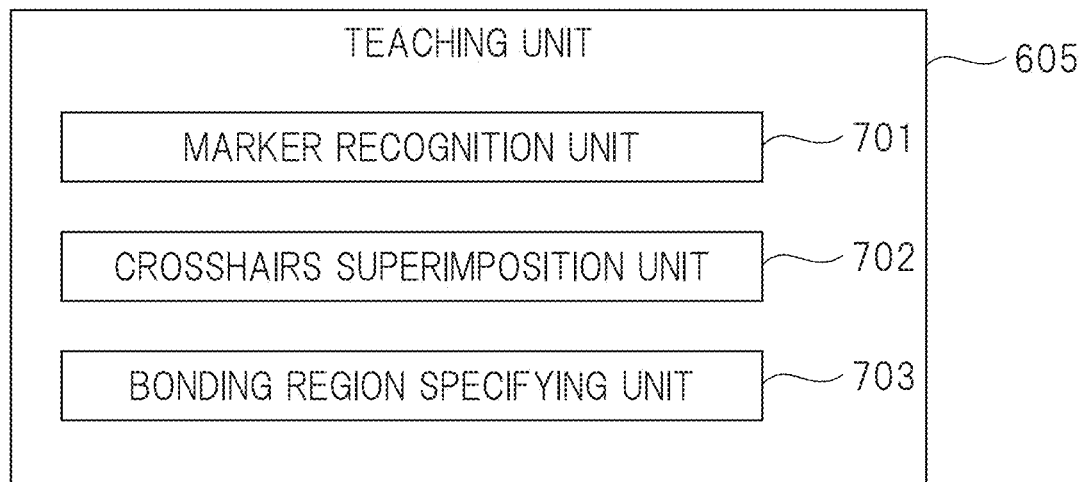
FIG. 17 is a block diagram showing a configuration of a teaching unit.

FIG. 17 is a block diagram showing the configuration of the teaching unit 605.

The teaching unit 605 has a marker recognition unit 701, a crosshairs superimposition unit 702, and a bonding region specifying unit 703.

The marker recognition unit 701 is configured to, for example, use an image recognition technique to recognize the marker provided on the pad or the opening portion open to the pad from the image taken by the camera 601 and displayed on the monitor 603.

For example, for the image shown in FIG. 8, the marker recognition unit 701 is configured to recognize the first marker MK1 provided on the first side S1 of the pad or the first side S1 of the opening portion, and to recognize the second marker MK2 provided on the second side S2 of the pad or the second side S2 of the opening portion. In detail, the marker recognition unit 701 is configured to recognize at least the first line segment LS1 orthogonal to the first side S1 at the first position (midpoint) of the first side S1, and recognize the first line segment LS2 orthogonal to the second side S2 at the first position (midpoint) of the second side S2.

The crosshairs superimposition unit 702 is configured to superimpose the marker recognized by the marker recognition unit 701 and the crosshairs displayed on the monitor 603. In other words, the crosshairs superimposition unit 702 is configured to control the camera moving unit 602 and move the camera 601, so that the marker recognized by the marker recognition unit 701 is superimposed on the crosshairs displayed on the monitor 603. For example, in FIG. 8, the crosshairs superimposition unit 702 is configured to move the camera 601, so that the horizontal line 500A partially constituting the crosshairs is superimposed on the first line segment LS1 of the first marker MK1, and the vertical line 500B partially constituting the crosshairs is superimposed on the first line segment LS2 of the second marker MK2.

In FIG. 8, for example, the bonding region specifying unit 703 is configured to specify the bonding region BR based on the intersection point of the crosshairs in a state where the horizontal line 500A is superimposed on the first line segment LS1 of the first marker MK1, and the vertical line 500B is superimposed on the first line segment LS2 of the second marker MK2.

Thus, the wire bonding apparatus is configured as described above.

Next, an operation of the wire bonding apparatus will be described.

Figure 18:
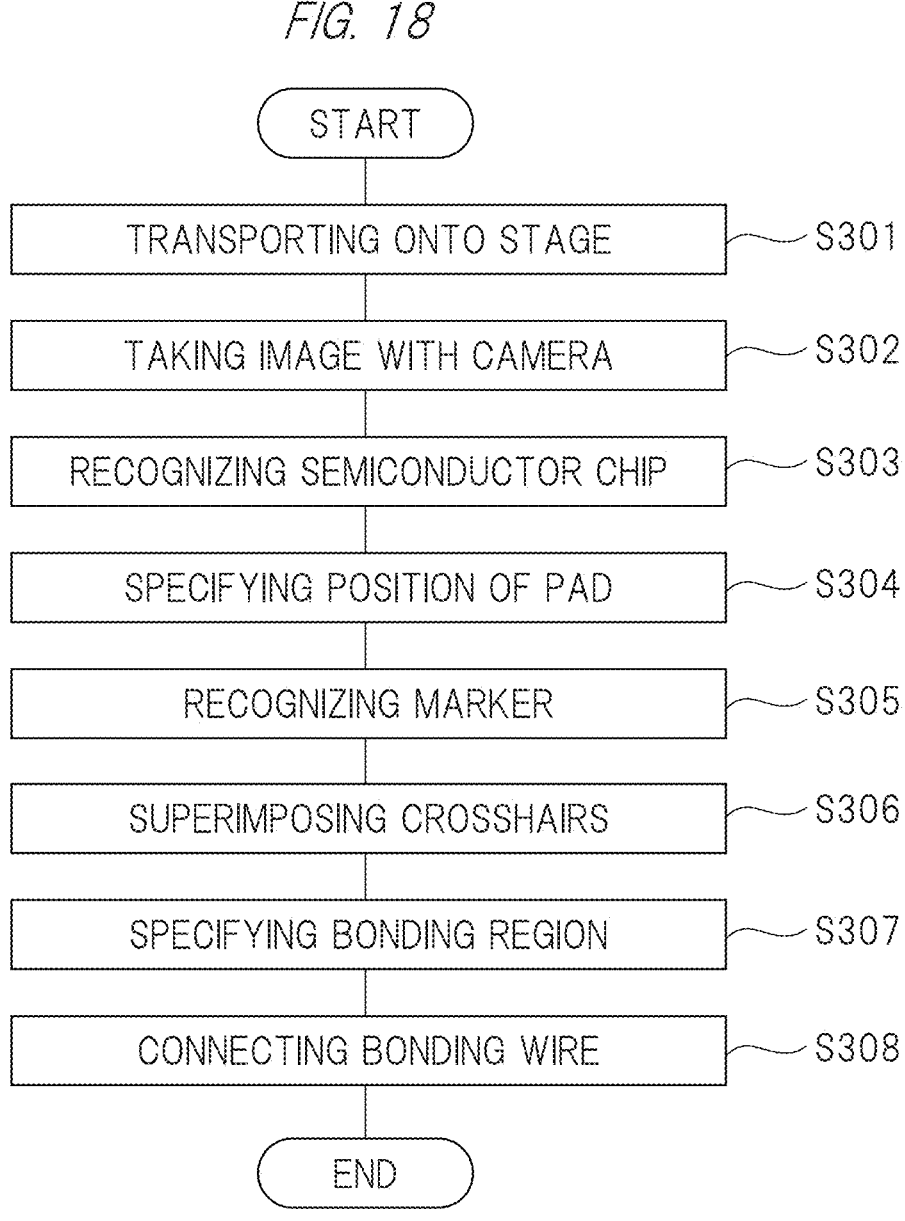
FIG. 18 is a flowchart describing an operation of the wire bonding apparatus.

FIG. 18 is a flowchart describing the operation of the wire bonding apparatus.

First, the semiconductor device being assembled is transported onto the stage of the wire bonding apparatus (S301). Then, an image of the semiconductor device transported onto the stage is taken by the camera 601 (S302). At this time, the image taken by the camera 601 is displayed on the monitor 603.

The semiconductor chip recognition unit 604 of the wire bonding apparatus recognizes the semiconductor chip based on the image of the semiconductor device displayed on the monitor 603 (S303). Specifically, the semiconductor chip is recognized by specifying the unique pattern from the displayed image. Then, the semiconductor chip recognition unit 604 specifies the position of the pad (source pad) based on coordinate data acquired in advance (S304).

Next, the marker recognition unit 701 of the wire bonding apparatus uses, for example, the image recognition technique to recognize the marker provided on the pad or the opening portion open to the pad (S305). At this time, the marker is provided on at least each of the two sides intersecting each other. Each of the two markers has a line segment orthogonal to the side on which the marker is provided. Particularly, the marker recognition unit 701 recognizes the above-described line segment in each of the two markers.

Next, the crosshairs superimposition unit 702 of the wire bonding apparatus uses the camera moving unit 602 to move the camera 601 to superimpose the crosshairs on the line segment of the marker recognized by the marker recognition unit 701 (S306). Specifically, the crosshairs superimposition unit 702 moves the camera 601 to superimpose the horizontal line of the crosshairs on the line segment of one of the two markers, and to superimpose the vertical line of the crosshairs on the line segment of the other of the two markers.

Then, the bonding region specifying unit 703 of the wire bonding apparatus specifies the bonding region based on the intersection point of the crosshairs superimposed on the line segments of the two markers by the crosshairs superimposition unit 702 (S307).

Thereafter, the bonding unit 606 of the wire bonding apparatus uses the bonding tool to connect the bonding wire to the bonding region of the pad based on information of the bonding region specified by the bonding region specifying unit 703 (S308).

Thus, the wire bonding apparatus operates as described above.

(2) Main Constituent: Operator

The main constituent of the "teaching" that achieves the fundamental concept is assumed to be the wire bonding apparatus. For example, by setting the main constituent of the "teaching" that achieves the fundamental concept to the wire bonding apparatus, the bonding region of the pad to which the bonding wire is connected can be accurately specified, and the "teaching" can be automated. Therefore, by setting the main constituent for the "teaching" to the wire bonding apparatus, the present invention is useful in that it is possible to suppress characteristic fluctuations of the semiconductor device caused by misalignment of the bonding position and to improve efficiency of the "teaching".

However, in order to perform the "teaching" that achieves the fundamental concept using a conventional wire bonding apparatus, it is necessary to modify the wire bonding apparatus that would lead to modification costs. Therefore, although it is desirable for the main constituent of the "teaching" that achieves the fundamental concept to be the wire bonding apparatus, the main constituent may be the operator.

That is, not only can the "teaching" that achieves the fundamental concept be applied to an operator, but the "teaching" can also specify the bonding region of the pad to which the bonding wire is connected more accurately than, for example, the "teaching" of the related art in which the scale is used for alignment, even when the "teaching" that achieves the fundamental concept is performed by an operator.

Therefore, the "teaching" that achieves the fundamental concept has a great technical significance in that it can specify the bonding region more accurately than the related art, not only when the main constituent is the wire bonding apparatus, but also when it is an operator.

Effects of the Embodiment

Next, effects of the present embodiment will be described.

Figure 19B:
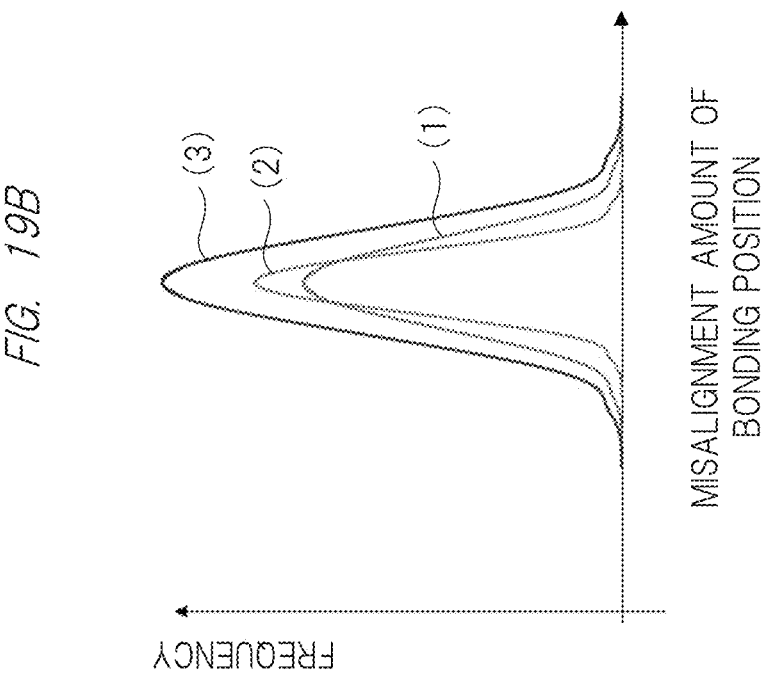
FIG. 19B is a graph showing relationships between a misalignment amount and frequency of bonding positions in an embodiment.
Figure 19A:
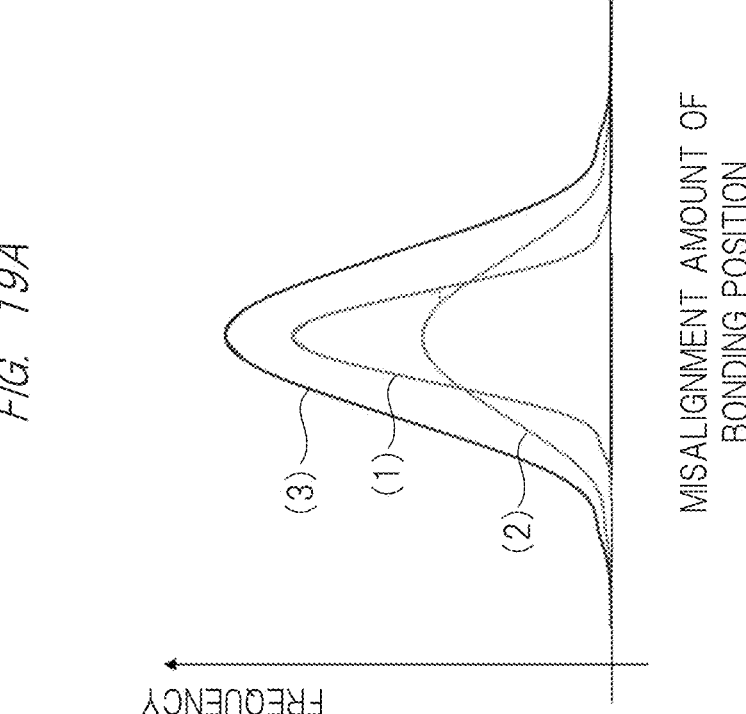
FIG. 19A is a graph showing relationships between a misalignment amount and frequency of bonding positions in the related art.

FIGS. 19A and 19B are graphs showing relationships between a misalignment amount and frequency of the bonding position. Particularly, FIG. 19A is a graph showing the relationship between the misalignment amount and frequency of the bonding position in the related art, and FIG. 19B is a graph showing the relationship between the misalignment amount and frequency of the bonding position in the present embodiment.

First, in FIGS. 19A and 19B, graph (1) shows a repetitive positioning precision of the wire bonding apparatus, which is a positioning precision dependent on a repetitive operation of a bonding mechanism of the wire bonding apparatus. On the other hand, graph (2) shows the positioning precision at the time of the "teaching", which is a positioning precision dependent on the "teaching". Graph (3) shows a positioning precision of a final bonding position at the time of wire bonding, which corresponds to a combination of the positioning precision of graphs (1) and (2).

Here, in the related art shown in FIG. 19A, it can be seen that variation in the misalignment amount is large in graph (2) showing the positioning precision at the time of the "teaching". In contrast, in the present embodiment shown in FIG. 19B, it can be seen that variation in the misalignment amount is reduced in graph (2) showing the positioning precision at the time of the "teaching". As a result, it can be seen that, in the present embodiment shown in FIG. 19B, variation in the misalignment amount can be reduced in graph (3) showing the positioning precision of the final bonding position at the time of wire bonding.

Thus, according to the present embodiment, it is possible to improve the positioning precision of the final bonding position at the time of wire bonding by performing the "teaching" that achieves the fundamental concept. As a result, according to the present embodiment, characteristic fluctuations of the semiconductor device caused by misalignment of the bonding position can be suppressed.

Particularly, for example, in a case where the bonding wire is connected to the source pad of the semiconductor device including the sense transistor, current detection precision by the sense transistor significantly fluctuates when misalignment of the bonding position occurs. In this regard, according to the present embodiment, it is advantageous in that the bonding region can be accurately specified, whereby misalignment of the bonding position can be reduced to ensure current detection precision by the sense transistor.

Fifth Modified Example

Figure 20:
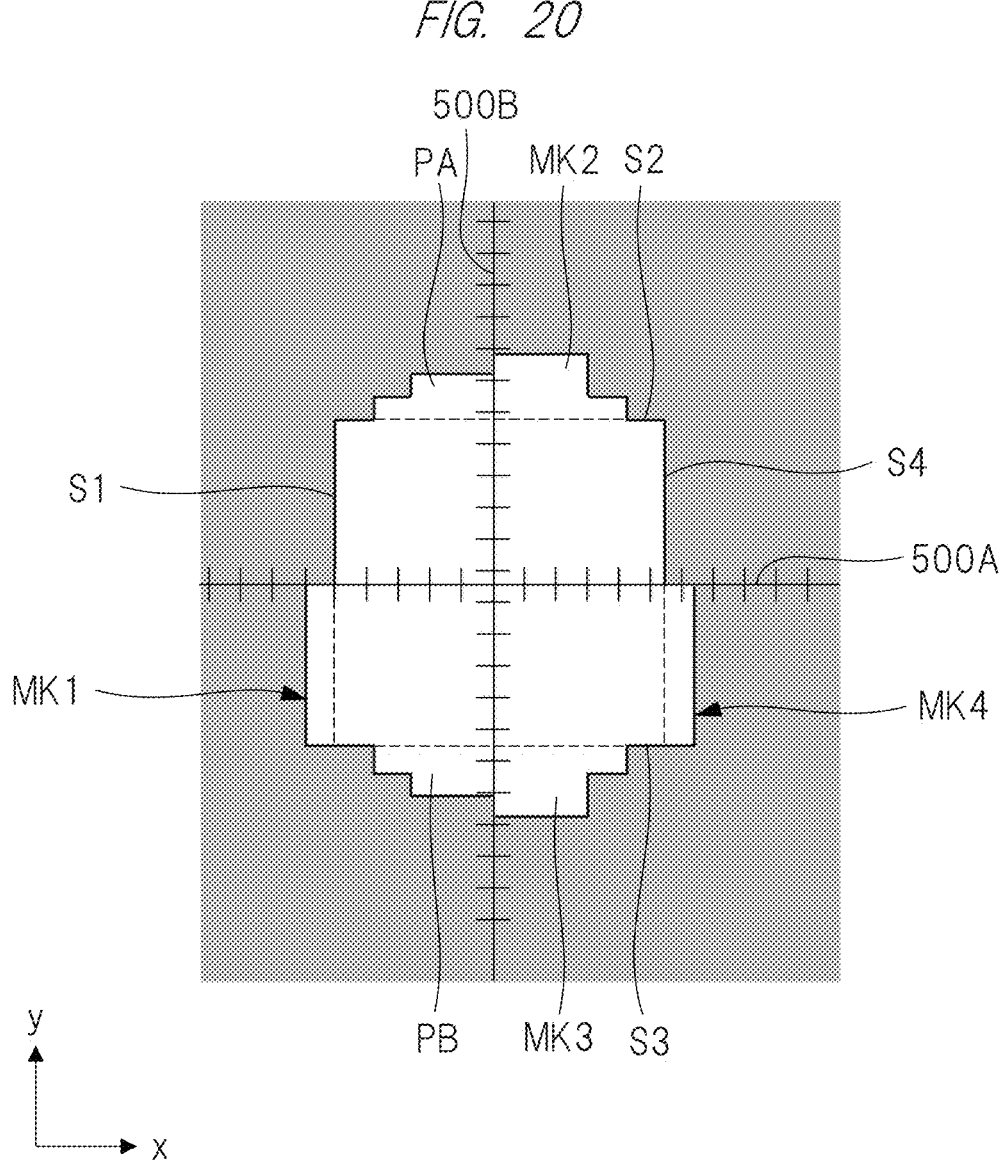
FIG. 20 is a plan view showing a pad structure in a fifth modified example.

FIG. 20 is a plan view showing a pad structure in a fifth modified example.

As shown in FIG. 20, in the fifth modified example, the pad or the opening portion is provided with markers and a stepped pattern. Specifically, the pad or the opening portion has the first side S1, the second side S2, the third side S3, and the fourth side S4. The first side S1 is provided with the first marker MK1, and the fourth side S4 is provided with the fourth marker MK4. On the other hand, the second side S2 is provided with the second marker MK2 and a stepped pattern PA. Moreover, the third side S3 is provided with the third marker MK3 and a stepped pattern PB.

Thus, additionally providing the pad or the opening portion with the stepped pattern PA and the stepped pattern PB allows the pad or the opening portion provided with the stepped pattern PA and the stepped pattern PB to have a unique pattern. That is, the pad or the opening portion shown in FIG. 20 can be a recognition pattern (unique pattern) used for recognizing the semiconductor chip in a recognition process of the semiconductor device on which the pad and the opening portion are formed, and performed prior to the "teaching".

For example, in the recognition process of the semiconductor chip, the unique pattern is specified such that the semiconductor chip is recognized and the position of the pad (source pad) is specified based on the position (point of origin) of the unique pattern and coordinate data acquired in advance.

In this regard, a gate pad having a unique wiring connection layout is typically selected as the unique pattern. However, in this case, the position of the pad (source pad) is specified based on the position (point of origin) of the gate pad serving as the unique pattern and coordinate data acquired in advance. At this time, the unique pattern and the pad (source pad) differ, whereby an error may occur when specifying the position of the pad (source pad), and there is a risk in that precision of specifying the position of the pad (source pad) may decrease.

On the other hand, in the fifth modified example, the pad (source pad) itself is set as the unique pattern in the recognition process of the semiconductor chip. As a result, the unique pattern in the recognition process of the semiconductor chip and the pad (source pad) that is a target for specifying the position are the same, whereby it is possible to reduce the error that occurs when specifying the position of the pad (source pad). Thus, according to the fifth modified example, precision of specifying the position of the pad (source pad) can be improved.

Sixth Modified Example

Figure 21:
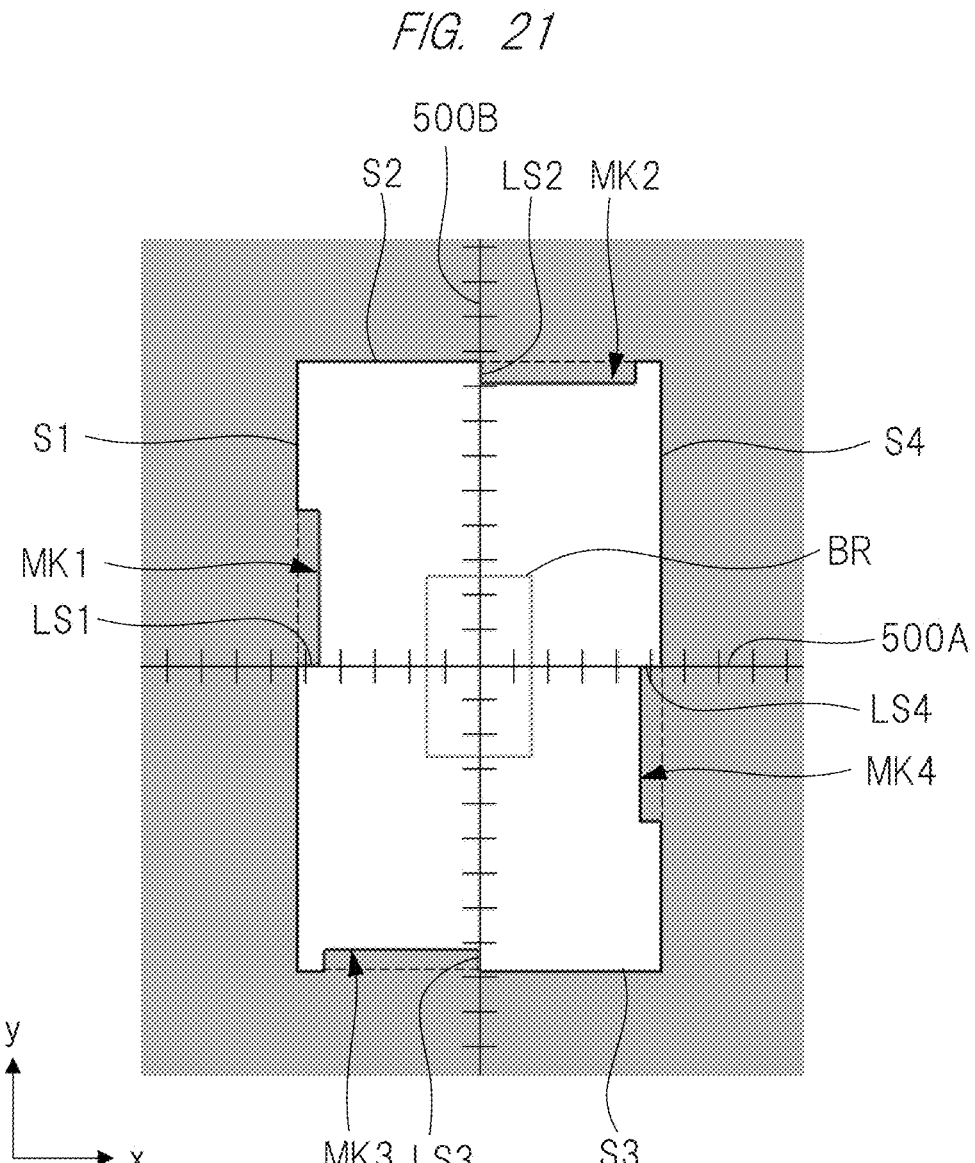
FIG. 21 is a plan view describing a pad structure in a sixth modified example.

FIG. 21 is a plan view describing a pad structure in a sixth modified example.

FIG. 21 shows an image of the pad or the opening portion displayed on the monitor of the wire bonding apparatus. Specifically, FIG. 21 shows the pad having a quadrangular planar shape or the opening portion having a quadrangular planar shape. The pad or the opening portion has the first side S1, the second side S2 intersecting the first side S1, the third side S3 intersecting the first side S1, and the fourth side S4 facing the first side S1.

Here, the first side S1 is provided with the first marker MK1 made of a recess, and the second side S2 is provided with the second marker MK2 made of a recess. Moreover, the third side S3 is provided with the third marker MK3 made of a recess, and the fourth side S4 is provided with the fourth marker MK4 made of a recess.

At this time, the first marker MK1 has the first line segment LS1 (side) orthogonal to the first side S1 at the first position (midpoint) of the first side S1. Moreover, the second marker MK2 has the first line segment LS2 (side) orthogonal to the second side S2 at the first position (midpoint) of the second side S2. The third marker MK3 has the first line segment LS3 (side) orthogonal to the third side S3 at the first position (midpoint) of the third side S3. Moreover, the fourth marker MK4 has a first line segment LS4 (side) orthogonal to the fourth side S4 at the first position (midpoint) of the fourth side S4.

Thus, each of the markers (first marker MK1 to fourth marker MK4) provided on the pad or the opening portion may be made of a recess.

Seventh Modified Example

Figure 22:
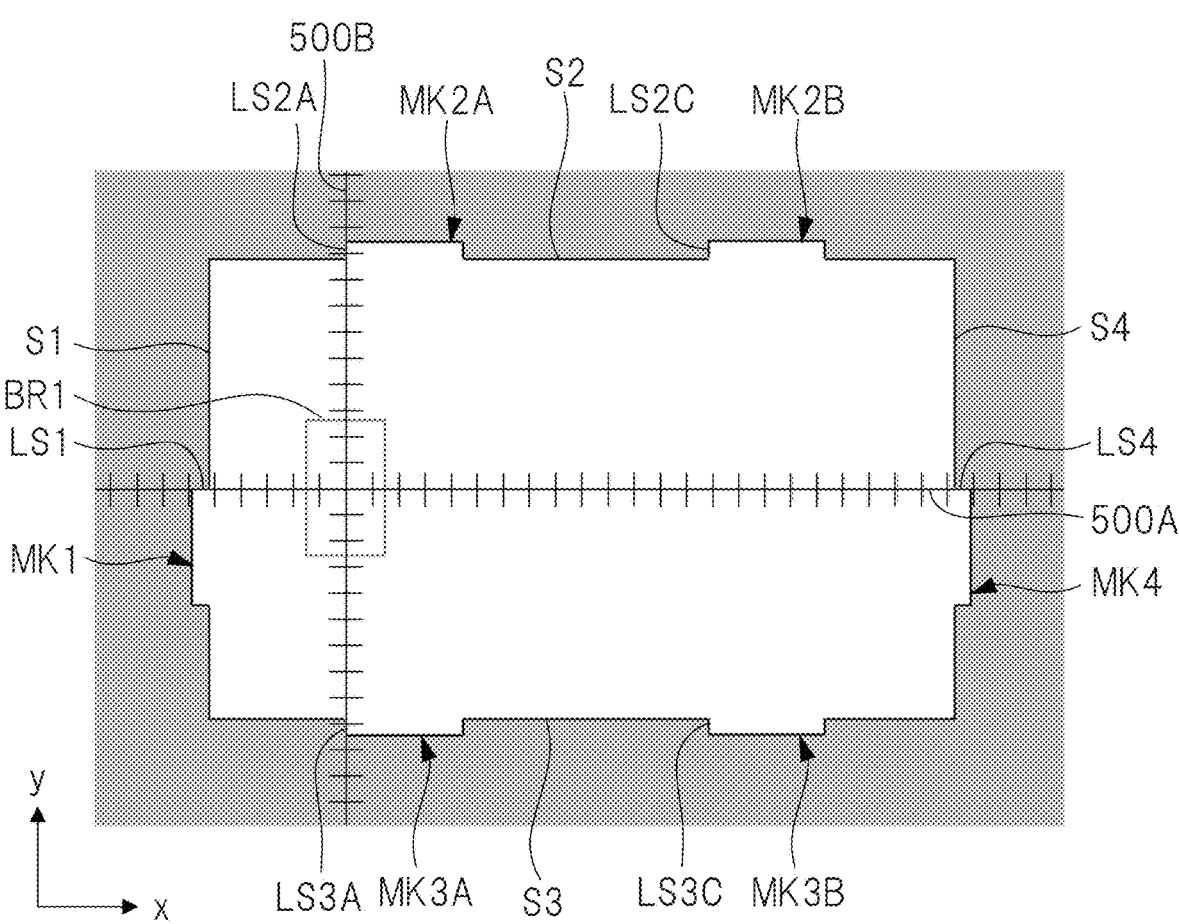
FIG. 22 is a plan view describing a pad structure in a seventh modified example.

FIG. 22 is a plan view describing a pad structure in a seventh modified example.

FIG. 22 shows an image of the pad or the opening portion displayed on the monitor of the wire bonding apparatus. Specifically, FIG. 22 shows the pad having a quadrangular planar shape or the opening portion having a quadrangular planar shape. The pad or the opening portion has the first side S1, the second side S2 intersecting the first side S1, the third side S3 intersecting the first side S1, and the fourth side S4 facing the first side S1.

Here, the first side S1 is provided with the first marker MK1, and the second side S2 is provided with a second marker MK2A and a second marker MK2B. Moreover, the third side S3 is provided with a third marker MK3A and a third marker MK3B, and the fourth side S4 is provided with the fourth marker MK4.

At this time, the first marker MK1 has the first line segment LS1 (side) orthogonal to the first side S1 at the first position (midpoint) of the first side S1. Moreover, the second marker MK2A has the first line segment LS2A (side) orthogonal to the second side S2 at a first position (position to the left of the midpoint) of the second side S2, and the second marker MK2B has a first line segment LS2C (side) orthogonal to the second side S2 at a second position (position to the right of the midpoint) of the second side S2. The third marker MK3A has the first line segment LS3A (side) orthogonal to the third side S3 at a first position (position to the left of the midpoint) of the third side S3, and the third marker MK3B has a first line segment LS3C (side) orthogonal to the third side S3 at a second position (position to the right of the midpoint) of the third side S3. Moreover, the fourth marker MK4 has the first line segment LS4 (side) orthogonal to the fourth side S4 at the first position (midpoint) of the fourth side S4.

Here, a bonding region BR1 for connecting a first bonding wire can be specified by having the horizontal line 500A partially constituting the crosshairs displayed on the monitor of the wire bonding apparatus superimposed on the first line segment LS1 of the first marker MK1, and having the vertical line 500B partially constituting the crosshairs superimposed on the first line segment LS2A of the second marker MK2A.

Moreover, although not shown in FIG. 22, a bonding region for connecting a second bonding wire can be specified by having the horizontal line 500A partially constituting the crosshairs displayed on the monitor of the wire bonding apparatus superimposed on the first line segment LS1 of the first marker MK1, and having the vertical line 500B partially constituting the crosshairs superimposed on the first line segment LS2C of the second marker MK2B.

Thus, according to the pad structure of the seventh modified example, the fundamental concept can be applied when specifying each of the bonding regions in a case where a plurality of the bonding wires (such as the first bonding wire and the second bonding wire) is connected to the pad.

In the foregoing, the invention made by the present inventor has been described in detail based on the embodiments. However, it goes without saying that the present invention is not to be limited to the above-described embodiments and can be variously modified without departing from the scope of the claims.

In the above-described embodiments, a power-MOSFET is assumed as a power transistor formed on a semiconductor chip. However, the technical concept of the above-described embodiment is not limited to this and can be widely applied to, for example, a semiconductor device that uses an insulated gate bipolar transistor (IGBT) as a power transistor. In such a case, the "source pad" is to be read as an "emitter pad".

What is claimed is:

1. A method of manufacturing a semiconductor device, comprising steps of:

(a) preparing a semiconductor chip having a main surface, a pad formed on the main surface, and an insulating film formed on the main surface;

(b) after the step of (a), specifying a bonding region in a portion of the pad exposed in an opening portion formed in the insulating film; and (c) after the step of (b), connecting a bonding wire to the bonding region of the pad, wherein a planar shape of the pad has a quadrangular shape including a first side and a second side intersecting the first side, wherein a planar shape of the opening portion has a quadrangular shape including a first side and a second side intersecting the first side, wherein the first side of the pad or the first side of the opening portion is further provided with a first marker, wherein the second side of the pad or the second side of the opening portion is further provided with a second marker, wherein the first marker has a first line segment orthogonal to the first side at a first position of the first side, wherein the second marker has a first line segment orthogonal to the second side at a first position of the second side, wherein, in the step of (b), the bonding region is specified by having a horizontal line partially constituting crosshairs displayed on a monitor of a wire bonding apparatus superimposed on the first line segment of the first marker, and having a vertical line partially constituting the crosshairs superimposed on the first line segment of the second marker.

2. The method of manufacturing a semiconductor device according to claim 1, wherein, in the step of (b), the wire bonding apparatus specifies the bonding region by having the horizontal line superimposed on the first line segment of the first marker, and having the vertical line superimposed on the first line segment of the second marker.

3. The method of manufacturing a semiconductor device according to claim 1, wherein the first marker has a second line segment intersecting the first line segment of the first marker and extending along the first side, and wherein the second marker has a second line segment intersecting the first line segment of the second marker and extending along the second side.

4. The method of manufacturing a semiconductor device according to claim 1, wherein the insulating film is comprised of:

an inorganic insulating film formed on the main surface; and an organic insulating film formed on the inorganic insulating film, wherein the opening portion is comprised of:

a first opening portion formed in the inorganic insulating film; and a second opening portion formed in the organic insulating film, wherein the first marker is provided on the first side of the first opening portion, and wherein the second marker is provided on the second side of the first opening portion.

5. The method of manufacturing a semiconductor device according to claim 1, wherein the first position of the first side is a center of the first side, and wherein the first position of the second side is a center of the second side.

6. The method of manufacturing a semiconductor device according to claim 1, wherein the pad further has a third side intersecting the first side of the pad and facing the second side of the pad, wherein the opening portion further has a third side intersecting the first side of the opening portion and facing the second side of the opening portion, wherein the third side of the pad or the third side of the opening portion is further provided with a third marker, wherein the third marker has a first line segment orthogonal to the third side at a first position of the third side, and wherein, in the step of (b), the bonding region is specified by having the horizontal line superimposed on the first line segment of the first marker, and having the vertical line superimposed on each of the first line segment of the second marker and the first line segment of the third marker.

7. The method of manufacturing a semiconductor device according to claim 1, wherein the pad or the opening portion is provided with the first marker, the second marker, and a stepped pattern, and wherein, in the step of recognizing a semiconductor chip on which the pad and the opening portion are formed prior to the step of (b), the pad or the opening portion is set as a recognition pattern for recognizing the semiconductor chip.

8. The method of manufacturing a semiconductor device according to claim 1, wherein the semiconductor chip has:

a power transistor composing a power-MOSFET or an IGBT; and a sense transistor configured to detect a current flowing through the power transistor, and wherein the pad is a source pad of the power-MOSFET or an emitter pad of the IGBT.

9. The method of manufacturing a semiconductor device according to claim 1, wherein each of the first marker and the second marker is made of a protrusion or a recess.

* * * * *